United States Patent
Oshima

(10) Patent No.: US 9,444,482 B2
(45) Date of Patent: Sep. 13, 2016

(54) ANALOG-TO-DIGITAL CONVERTER

(71) Applicant: HITACHI, LTD., Chiyoda-ku, Tokyo (JP)

(72) Inventor: Takashi Oshima, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/900,902

(22) PCT Filed: Jun. 27, 2013

(86) PCT No.: PCT/JP2013/067698
§ 371 (c)(1),
(2) Date: Dec. 22, 2015

(87) PCT Pub. No.: WO2014/207870
PCT Pub. Date: Dec. 31, 2014

(65) Prior Publication Data
US 2016/0142068 A1 May 19, 2016

(51) Int. Cl.
*H03M 1/10* (2006.01)
*H03M 1/06* (2006.01)
*H03M 1/00* (2006.01)

(52) U.S. Cl.
CPC .......... *H03M 1/1038* (2013.01); *H03M 1/002* (2013.01); *H03M 1/0609* (2013.01); *H03M 1/0612* (2013.01)

(58) Field of Classification Search
None
See application file for complete search history.

(56) References Cited

U.S. PATENT DOCUMENTS

| | | | | | |
|---|---|---|---|---|---|
| 6,081,215 | A * | 6/2000 | Kost | ............... | H03M 1/1028 341/118 |
| 6,445,317 | B2 * | 9/2002 | Lundin | ............... | H03M 1/1038 341/118 |
| 8,077,065 | B2 * | 12/2011 | Iso | ............... | H03M 1/1028 341/118 |
| 9,124,284 | B2 * | 9/2015 | Kimura | ............... | H03M 1/0634 |
| 2015/0381192 | A1 * | 12/2015 | Yamamoto | ......... | H03M 1/1009 341/120 |

OTHER PUBLICATIONS

Chiu, Y. et al.; "Least mean square adaptive digital background calibration of pipelined analog-to-digital converters"; IEEE Transactions on Circuits and Systems I; vol. 51; pp. 38-46; Jan. 2004.
Liu, W. et al.; "A 12b 22.5/45MS/s 3.0mW 0.059mm2 CMOS SAR ADC achieving over 90Db SFDR"; 2010 IEEE International Solid-State Circuits Conference Digest of Technical Papers; pp. 380-381; Feb. 2010.

* cited by examiner

*Primary Examiner* — Howard Williams
(74) *Attorney, Agent, or Firm* — Miles & Stockbridge P.C.

(57) ABSTRACT

Improvement of conversion precision in an analog-to-digital converter is realized. Therefore, a voltage of a correction signal and a voltage obtained by attenuating the voltage with a fixed attenuation rate by an attenuation circuit 21 are generated and each voltage is input to an analog-to-digital conversion unit 23. A correction unit 20a receives a digital output from the analog-to-digital conversion unit 23, searches a correction coefficient $W_i$ of each bit of the analog-to-digital conversion unit 23, based on an adaptive control algorithm, and corrects the digital output from the analog-to-digital conversion unit 23 using the searched correction coefficient $W_i$.

15 Claims, 15 Drawing Sheets

ANALOG-TO-DIGITAL CONVERTER

TECHNICAL FIELD

The present invention relates to an analog-to-digital converter and, for example, to an analog-to-digital converter that improves precision with digital correction.

BACKGROUND ART

For example, as for a digital correction type analog-to-digital converter disclosed in NPL 1, an analog-to-digital converter for a comparison having a low speed and high precision as compared with the analog-to-digital converter of a correction target is connected in parallel to an input of the analog-to-digital converter of the correction target and correction is performed using a digital output of the analog-to-digital converter for the comparison as a reference signal. In addition, an analog-to-digital converter capable of executing digital correction without using the reference signal in which such precision is required is disclosed in NPL 2.

CITATION LIST

Patent Literature

NPL 1: Y. Chiu, C. W. Tsang, B. Nikolic and P. R. Gray, "Least mean square adaptive digital background calibration of pipelined analog-to-digital converters," IEEE Transactions on Circuits and Systems I, Vol. 51, pp. 38-46, January 2004.

NPL 2: W. Liu, P. Huang and Y. Chiu, "A 12b 22.5/45MS/s 3.0 mW 0.059 mm2 CMOS SAR ADC achieving over 90 dB SFDR," 2010 IEEE International Solid-State Circuits Conference Digest of Technical Papers, pp. 380-381, February 2010.

SUMMARY OF INVENTION

Technical Problem

The digital correction type analog-to-digital converter includes an analog-to-digital conversion unit that converts an analog signal into a digital signal and a digital correction unit that receives a digital output of the analog-to-digital conversion unit and executes digital correction on the digital output. The digital correction type analog-to-digital converter can maintain high conversion precision by compensating for performance insufficiency of an analog circuit unit with digital correction. Because the analog circuit having low performance may be used, consumption power and a circuit area can be greatly reduced.

For example, in the case of a pipeline analog-to-digital converter and a cyclic analog-to-digital converter, linearity of an analog-to-digital conversion characteristic of the analog-to-digital conversion unit decreases due to an influence of insufficient open loop gain and non-linearity of an operational amplifier and conversion precision is deteriorated. By executing digital correction on the influence, an operational amplifier having low performance can be adopted. In addition, a variation of a capacity value of a capacitive element also decreases the linearity of the conversion characteristic. However, because the variation of the capacity value can be allowed by executing the digital correction, a capacitive element having a small capacity value can be adopted. As a result, the consumption power and the circuit area of the analog-to-digital converter can be greatly reduced.

In the case of a successive comparison type analog-to-digital converter, the variation of the capacity value of the capacitive element decreases the linearity of the conversion characteristic. However, because the variation of the capacity value can be allowed by executing the digital correction, a capacitive element having a small capacity value can be adopted. As a result, the consumption power and the circuit area of the analog-to-digital converter can be greatly reduced.

However, when the digital correction is executed by a general method according to the related art, a reference signal is necessary for the correction. The reference signal needs to have high precision and conversion precision of the analog-to-digital converter after the correction is restricted by a signal quality of the reference signal. For example, in the case of using the digital correction type analog-to-digital converter disclosed in NPL 1, the conversion precision of the analog-to-digital converter after the correction is restricted by the conversion precision of the analog-to-digital converter for the comparison. For this reason, it is thought that it is difficult to obtain conversion precision of about 13 bits or more, in the correction using the reference signal.

Therefore, it is thought that a method disclosed in NPL 2 is used as a method of executing the digital correction without using the reference signal. FIG. 1 is a schematic diagram illustrating a configuration example of an analog-to-digital converter examined as a premise of the present invention. In the analog-to-digital converter illustrated in FIG. 1, in addition to an original input signal, a positive direct-current voltage shift "+$\Delta$" and a negative direct-current voltage shift "−$\Delta$" are alternately applied to an analog-to-digital conversion unit (ADC). A mechanism for applying the direct-current voltage shift can be realized equivalently by adding a capacitive element or a switch to an internal circuit of the analog-to-digital conversion unit (ADC).

An odd-numbered sample-side digital correction unit and an even-numbered sample-side digital correction unit execute digital correction on a digital output corresponding to an odd-numbered sample of the analog-to-digital conversion unit (ADC) and a digital output corresponding to an even-numbered sample, respectively, using a correction coefficient. The correction coefficient is searched such that a difference of an output of the even-numbered sample-side digital correction unit after the correction and an output of the odd-numbered sample-side digital correction unit after the correction becomes "2$\Delta$" expected from an input. Thereby, the digital correction can be executed using the searched correction coefficient. In this method, a direct-current voltage shift value may vary from a design value, as long as the value is constant at all times.

However, in the method illustrated in FIG. 1, the internal circuit or the layout of the analog-to-digital conversion unit needs to be changed to mount the direct-current voltage shift mechanism and the circuit or the layout of the existing analog-to-digital conversion unit cannot be applied. In addition, when the direct-current voltage shift is mounted on a front step of the analog-to-digital conversion unit without mounting the direct-current voltage shift mechanism in the analog-to-digital conversion unit, an analog addition circuit by an operational amplifier is necessary. As a result, the direct-current voltage shift is not maintained constantly due to a distortion characteristic or a response characteristic of the operational amplifier and correction precision may be deteriorated. For example, even when a commercially available analog-to-digital converter having lower precision is mounted on a board and digital correction is executed on an output thereof using a field programmable gate array (FPGA) or a microcomputer on the board, the addition circuit by the operational amplifier needs to be mounted on the board. For this reason, the correction precision may be deteriorated, similar to the above case.

Embodiments to be described below have been made in view of such circumstances and other object and a new feature will be apparent from the description of the present specification and the accompanying drawings.

Solution to Problem

An outline of a representative embodiment of the invention disclosed in the present disclosure is described simply as follows.

An analog-to-digital converter according to this embodiment has an attenuation circuit, a first selection circuit, an analog-to-digital conversion unit, and a correction unit. A plurality of first analog voltages having different voltage values are sequentially input to the attenuation circuit and the attenuation circuit attenuates the plurality of first analog voltages with a predetermined attenuation rate and sequentially outputs a plurality of second analog voltages. The first and second analog voltages of a plurality of sets including sets of the first analog voltages and the second analog voltages obtained by attenuating the first analog voltages are sequentially input to the first selection circuit and the first selection circuit selects each analog voltage of the first and second analog voltages of the plurality of sets at different timing and outputs each analog voltage. The analog-to-digital conversion unit converts the first and second analog voltages of the plurality of sets output from the first selection circuit into first and second digital signals of a plurality of sets. The correction unit searches M (M is an integer of 1 or more) correction coefficients multiplied with M bits of the first and second digital signals of the plurality of sets, based on the first and second digital signals of the plurality of sets.

Advantageous Effects of Invention

According to an effect obtained by a representative embodiment of the invention disclosed in the present disclosure, improvement of conversion precision in an analog-to-digital converter can be realized.

DESCRIPTION OF EMBODIMENTS

Figure 1:
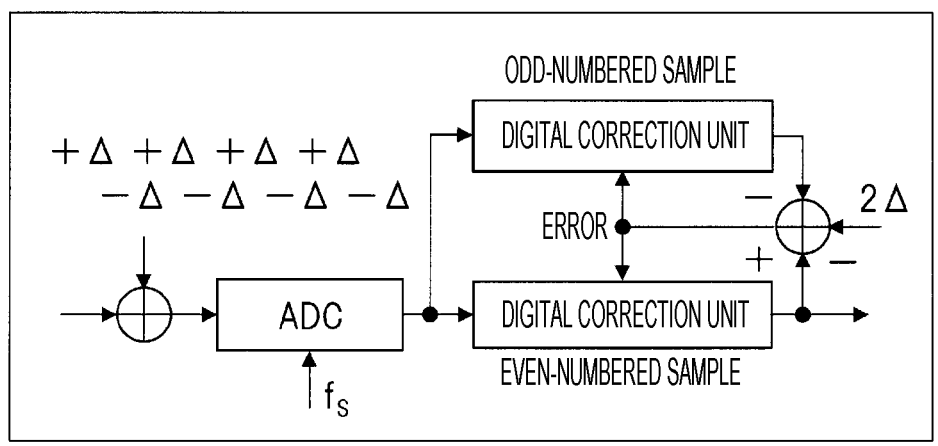
FIG. 1 is a schematic diagram illustrating a configuration example of an analog-to-digital converter examined as a premise of the present invention.

In embodiments described below, the invention will be described in a plurality of sections or embodiments when required as a matter of convenience. However, these sections or embodiments are not irrelevant to each other unless otherwise stated and one relates to the entire or part of the other as a modification, details, or a supplementary explanation thereof. In addition, in the embodiments described below, when referring to the number of elements (including the number of pieces, numerical values, amounts, ranges, and the like), the number of the elements is not limited to a specific number unless otherwise stated and except for the case in which the number is apparently limited to a specific number in principle and the number larger or smaller than the specified number is also applicable.

In addition, in the embodiments described below, it goes without saying that components (including element steps and the like) are not always indispensable unless otherwise stated and except for the case in which the components are apparently indispensable in principle. Similarly, in the embodiments described below, when shapes of the components, a positional relation thereof, and the like are mentioned, the substantially approximate and similar shapes and the like are included therein unless otherwise stated and except for the case in which it is conceivable that they are apparently excluded in principle. The same is applicable to the numerical values and the ranges described above.

Hereinafter, embodiments of the present invention will be described in detail based on the drawings. In all drawings to describe the embodiments, the same members are denoted by the same reference numerals in principle and repeated explanation thereof is omitted.

First Embodiment

Schematic Configuration of Analog-to-Digital Converter

Figure 2A:
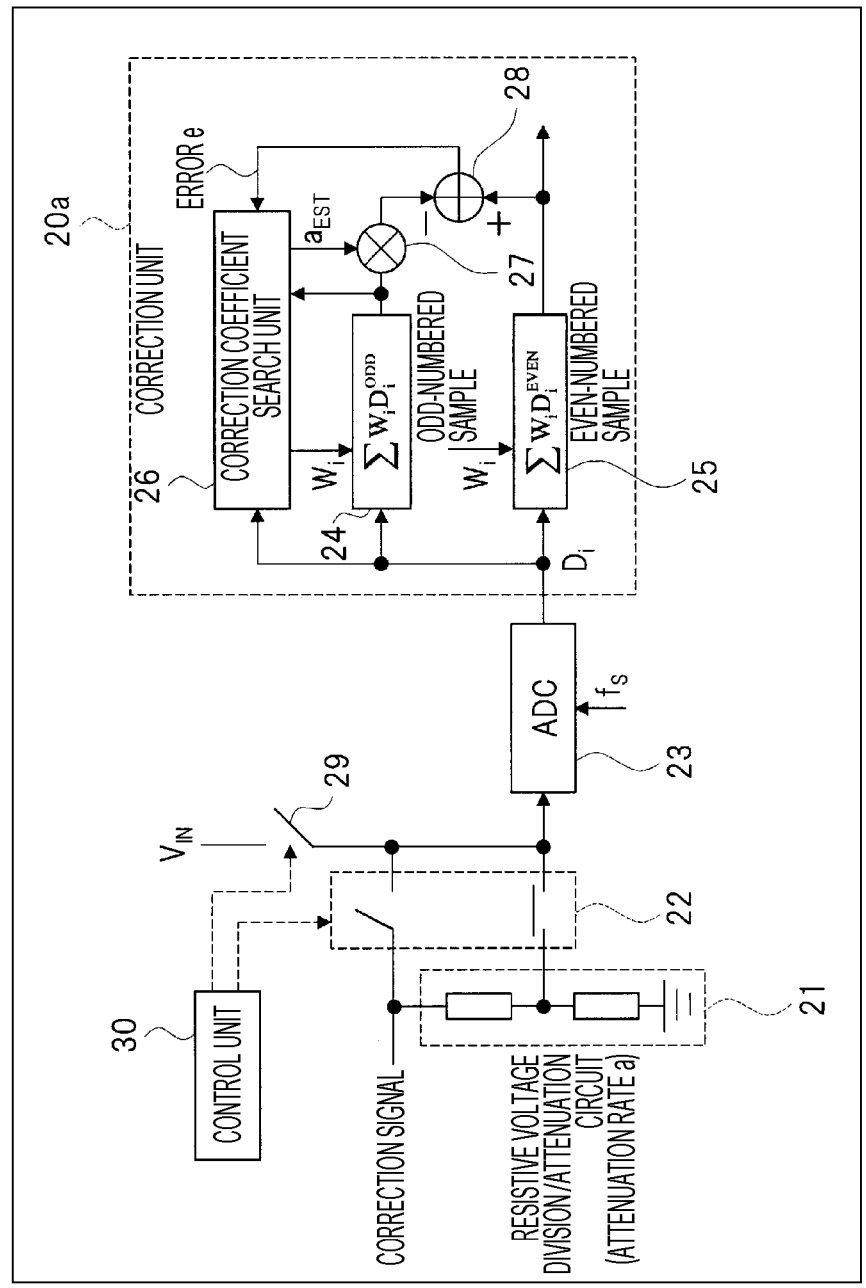
FIG. 2A is a schematic diagram illustrating a configuration example of an analog-to-digital converter according to a first embodiment of the present invention.
Figure 2B:
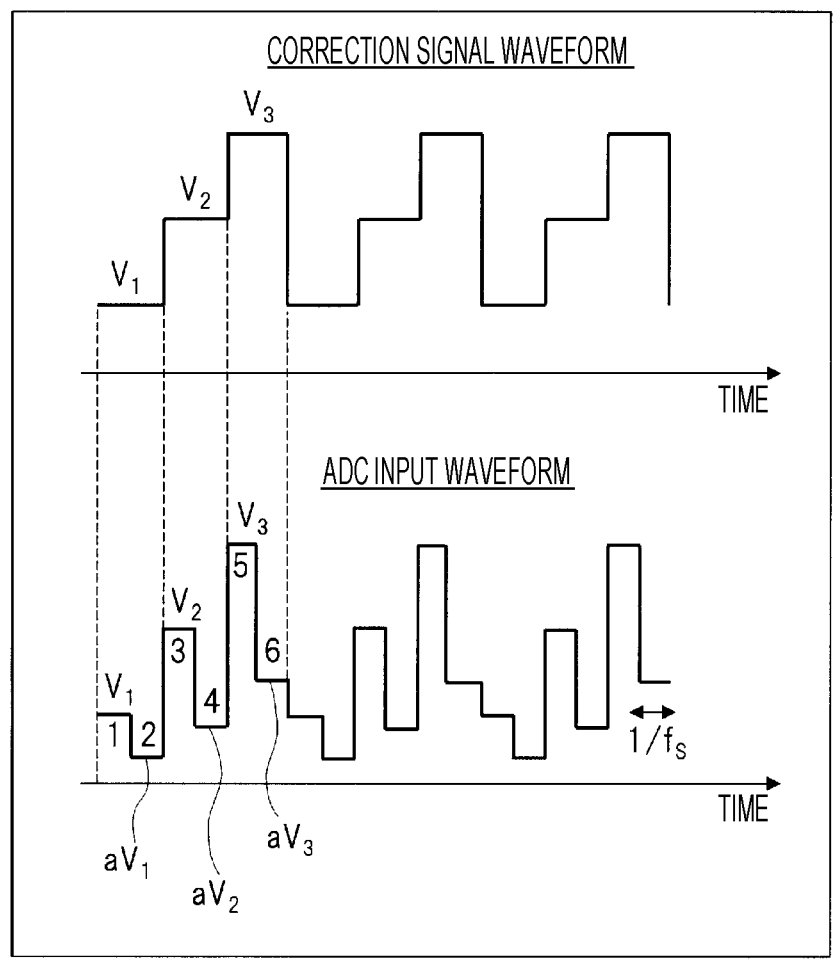
FIG. 2B is a waveform diagram illustrating an example of an analog signal input to an analog-to-digital conversion unit of FIG. 2A.

FIG. 2A is a schematic diagram illustrating a configuration example of an analog-to-digital converter according to a first embodiment of the present invention. FIG. 2B is a waveform diagram illustrating an example of an analog signal input to an analog-to-digital conversion unit of FIG. 2A. In FIG. 2A, an attenuation circuit 21 is connected to a correction signal application terminal and output nodes of the correction signal application terminal and the attenuation circuit 21 are connected to two input nodes of a path switching multiplexer (first selection circuit) 22, respectively. An output of the path switching multiplexer 22 is input to an analog-to-digital conversion unit (ADC) 23. In this example, the attenuation circuit 21 includes a resistive voltage division circuit.

A digital output $D_i$ (i=1, 2, ..., and M) of M bits of the analog-to-digital conversion unit 23 is input to an odd-numbered sample-side digital correction unit 24 and an even-numbered sample-side digital correction unit 25. The odd-numbered sample-side digital correction unit 24 outputs an analog-to-digital conversion result (first digital signal after correction) after odd-numbered sample-side correction, based on an odd-numbered digital output (first digital signal) $D_i^{ODD}$ (i=1, 2, ..., and M) of the analog-to-digital conversion unit 23 and a correction coefficient $W_i$ supplied from a correction coefficient search unit 26. The even-numbered sample-side digital correction unit 25 outputs an analog-to-digital conversion result (second digital signal after the correction) after even-numbered sample-side correction, based on an even-numbered digital output (second digital signal) $D_i^{EVEN}$ (i=1, 2, ..., and M) of the analog-to-digital conversion unit 23 and the correction coefficient $W_i$ supplied from the correction coefficient search unit 26.

A multiplication unit 27 outputs a multiplication result of the analog-to-digital conversion result after the odd-numbered sample-side correction and an attenuation rate estimation value (attenuation coefficient) $a_{EST}$ supplied from the correction coefficient search unit 26. A subtraction unit (error detection unit) 28 outputs a result obtained by subtracting the multiplication result from the analog-to-digital conversion result after the even-numbered sample-side correction. The subtraction result is input as an "error e" to the correction coefficient search unit 26. The correction coefficient search unit 26 searches the correction coefficient $W_i$ and the attenuation rate estimation value $a_{EST}$, based on the error e, the digital output $D_i$ (i=1, 2, ..., and M) of the analog-to-digital conversion unit 23, and the analog-to-digital conversion result after the odd-numbered sample-side correction, and outputs a search result to the odd-numbered sample-side digital correction unit 24, the even-numbered sample-side digital correction unit 25, and the multiplication unit 27.

The odd-numbered sample-side digital correction unit 24, the even-numbered sample-side digital correction unit 25, the correction coefficient search unit 26, the multiplication unit 27, and the subtraction unit 28 configure a correction unit 20a. The correction unit 20a is not limited in particular. However, the correction unit 20a can be realized by a digital operation circuit such as an FPGA and a processor, for example. In addition, a switch (input switch) 29 for an input path is connected to an input node of the analog-to-digital conversion unit 23, in parallel to the path switching multiplexer 22. When the switch 29 for the input path is controlled to ON, the switch 29 for the input path inputs an original input signal voltage (analog input voltage) $V_{IN}$ to the analog-to-digital conversion unit 23. ON/OFF of the switch 29 for the input path or selection of the path switching multiplexer 22 is controlled by a control unit 30.

<<Correction Coefficient Search Operation of Analog-to-Digital Converter>>

As illustrated in a "correction signal waveform" of FIG. 2B, a correct signal (first analog signal) has a plurality of (in this example, three) analog voltages (first analog voltages) $V_1$ to $V_3$ changing stepwise and a value of each analog voltage is accurately held by two cycles of an analog-to-digital conversion cycle. As illustrated in an "ADC input waveform" of FIG. 2B, the voltages ($V_1$ to $V_3$) of the correction signal are directly input to the analog-to-digital conversion unit 23 at odd-numbered analog-to-digital conversion cycles and voltages (second analog voltages) ($aV_1$ to $aV_3$) obtained by attenuating the correction signal a times by the attenuation circuit 21 are input to the analog-to-digital conversion unit 23 at even-numbered analog-to-digital conversion cycles. The control unit 30 selects the path switching multiplexer 22, such that a waveform becomes the "ADC input waveform". Specifically, the control unit 30 selects the correction signal in some period (here, a half period) of each cycle and selects an output signal (second analog signal) from the attenuation circuit 21 in the remaining period, at each cycle of the correction signal.

When an input is performed with respect to the analog-to-digital conversion unit 23 as illustrated in FIG. 2B, an input voltage ratio of the odd-numbered sample and the even-numbered sample adjacent to each other to the analog-to-digital conversion unit 23 becomes a constant value a at all times. Such a situation is created intentionally, so that the correction coefficient $W_i$ to compensate for non-linearity caused by conversion of the analog-to-digital conversion unit 23 can be searched. Specifically, the correction coefficient search unit 26 searches the correction coefficient $W_i$ and the attenuation rate estimation value $a_{EST}$ by the following adaptive control algorithm, such that a value obtained by multiplying the analog-to-digital conversion result after the odd-numbered sample-side correction with the attenuation rate estimation value $a_{EST}$ is equal to the analog-to-digital conversion result after the even-numbered sample-side correction becoming a pair thereof, based on a relation of the odd-numbered/even-numbered samples.

The odd-numbered sample-side digital correction unit 24 calculates the analog-to-digital conversion result (first digital signal after the correction) $D_{OUT}^{ODD}$ after the odd-numbered sample-side correction by a formula (1), based on the odd-numbered digital output (first digital signal) $D_i^{ODD}$ (i=1, 2, ..., and M) of the analog-to-digital conversion unit and the correction coefficient $W_i$ supplied from the correction coefficient search unit 26, as described above.

[Mathematical Formula 1] (Formula 1)

$$D_{OUT}^{ODD} = \sum_{i=1}^{M} W_i \cdot D_i^{ODD}$$

Likewise, the even-numbered sample-side digital correction unit 25 calculates the analog-to-digital conversion result (second digital signal after the correction) $D_{OUT}^{EVEN}$ after the even-numbered sample-side correction by a formula (2), based on the even-numbered digital output (second digital signal) $D_i^{EvEN}$ (i=1, 2, ..., and M) of the analog-to-digital conversion unit 23 and the correction coefficient $W_i$ supplied from the correction coefficient search unit 26.

[Mathematical Formula 2]  (Formula 2)

$$D_{OUT}^{EVEN} = \sum_{i=1}^{M} W_i \cdot D_i^{EVEN}$$

The multiplication unit 27 multiplies $D_{OUT}^{ODD}$ and $a_{EST}$ and obtains a multiplication result. The subtraction unit (error detection unit) 28 calculates a difference of $D_{OUT}^{EVEN}$ and the multiplication result as an error e by a formula (3).

[Mathematical Formula 3]

$$e = D_{OUT}^{EVEN} - a_{EST} \cdot D_{OUT}^{ODD} \quad \text{(Formula 3)}$$

The correction coefficient search unit 26 searches the correction coefficient $W_i$ and the attenuation rate estimation value $a_{EST}$, based on the error e and the digital outputs $D_i^{ODD}$, $D_i^{EVEN}$, and $D_{OUT}^{ODD}$ of the analog-to-digital conversion unit 23, as described above. For example, when the search is performed by a least mean square (LMS) algorithm, $W_i$ can be searched by a formula (4) and $a_{EST}$ can be searched by a formula (5). a is a design value of the attenuation rate of the attenuation circuit 21.

[Mathematical Formula 4]

$$W_i^{(NEW)} = W_i^{(OLD)} - \mu_{Wi} \cdot e \cdot (D_i^{EVEN} - a \cdot D_i^{ODD}) \quad \text{(Formula 4)}$$

[Mathematical Formula 5]

$$a_{EST}^{(NEW)} = a_{EST}^{(OLD)} + \mu_a \cdot e \cdot D_{OUT}^{ODD} \quad \text{(Formula 5)}$$

Here, $\mu W_i$ and $\mu_a$ show step sizes of the LMS algorithm and may be set to appropriate values in consideration of a trade-off of a search speed and search precision. To exclude uncertainty (for example, with respect to a solution of Wi, constant multiplication of $W_i$ can also become the solution) of a search result, the operation is executed in a state in which a correction coefficient $W_1$ of an MSB is fixed to 1/2. Thereby, a correction coefficient value $W_i$ after the search becomes $1/2/W_1$ times ($W_1$ is a real value of an MSB correction coefficient) uniformly for a real value. As a result, a conversion gain error of $1/2/W_1$ times occurs. However, because a relative ratio between individual values of Wi is equal to a ratio between real values, the linearity of the analog-to-digital conversion is completely compensated for. In addition, $a_{EST}$ converges into a.

When the analog-to-digital conversion unit 23 uses a pipeline type, the analog-to-digital conversion unit 23 has a series connection configuration of multiplying DAC (MDAC) circuits. In this case, the linearity of the analog-to-digital conversion can be improved by correcting third-order distortion or fifth-order distortion of an operational amplifier used in an MDAC circuit of an initial step. For example, when the third-order distortion is corrected, the odd-numbered sample-side digital correction unit 24 calculates the analog-to-digital conversion result $D_{OUT}^{ODD}$ after the odd-numbered sample-side correction by a formula (6), based on the odd-numbered digital output $D_i^{ODD}$ (i=1, 2, . . . , and M) of the analog-to-digital conversion unit 23, the correction coefficient $W_i$ supplied from the correction coefficient search unit 26, and a third-order distortion correction coefficient $B_3$.

[Mathematical Formula 6]  (Formula 6)

$$D_{OUT}^{ODD} = \sum_{i=1}^{M} W_i \cdot D_i^{ODD} + B_3 \cdot \left( \sum_{i=2}^{M} W_i \cdot D_i^{ODD} \right)^3$$

Likewise, the even-numbered sample-side digital correction unit 25 calculates the analog-to-digital conversion result $D_{OUT}^{EVEN}$ after the even-numbered sample-side correction by a formula (7), based on the even-numbered digital output $D_i^{EVEN}$ (i=1, 2, . . . , and M) of the analog-to-digital conversion unit 23, the correction coefficient $W_i$ supplied from the correction coefficient search unit 26, and $B_3$.

[Mathematical Formula 7]  (Formula 7)

$$D_{OUT}^{EVEN} = \sum_{i=1}^{M} W_i \cdot D_i^{EVEN} + B_3 \cdot \left( \sum_{i=2}^{M} W_i \cdot D_i^{EVEN} \right)^3$$

Then, similar to the above, the error e is calculated and the correction coefficient search unit 26 searches the correction coefficient $W_i$ by the formula (4), searches the attenuation rate estimation value $a_{EST}$ by the formula (5), and searches the third-order distortion correction coefficient $B_3$ by a formula (8), based on the error e and the digital outputs $D_i^{ODD}$, $D_i^{EVEN}$, and $D_{OUT}^{ODD}$ of the analog-to-digital conversion unit 23. Here, $\mu_{B3}$ may be set to an appropriate value, in consideration of a trade-off of a search speed and search precision.

[Mathematical Formula 8]  (Formula 8)

$$B_3^{(NEW)} = B_3^{(OLD)} - \mu_{B3} \cdot e \cdot \left\{ \left( \sum_{i=2}^{M} W_i \cdot D_i^{EVEN} \right)^3 - a \cdot \left( \sum_{i=2}^{M} W_i \cdot D_i^{ODD} \right)^3 \right\}$$

The correction coefficient search unit 26 can search the correction coefficient by removing an influence of a direct-current offset voltage of the analog-to-digital conversion unit 23. In this case, a resultant (formula (9)) obtained by subtracting a direct-current correction coefficient $\Delta V_{DC}$ from the error e is set as an error e' and the correction coefficient $W_i$ and the attenuation rate estimation value $a_{EST}$ are searched by formulas (10) and (11) obtained by substituting e of the formulas (4) and (5) with e'. In addition, the direct-current correction coefficient $\Delta V_{DC}$ is searched by a formula (12).

[Mathematical Formula 9]

$$e' = e - \Delta V_{DC} \quad \text{(Formula 9)}$$

[Mathematical Formula 10]

$$W_i^{(NEW)} = W_i^{(OLD)} - \mu_{Wi} \cdot e' \cdot (D_i^{EVEN} - a \cdot D_i^{ODD}) \quad \text{(Formula 10)}$$

[Mathematical Formula 11]

$$a_{EST}^{(NEW)} = a_{EST}^{(OLD)} + \mu_a \cdot e' \cdot D_{OUT}^{ODD} \quad \text{(Formula 11)}$$

[Mathematical Formula 12]

$$\Delta V_{DC}^{(NEW)} = \Delta V_{DC}^{(OLD)} + \mu_{\Delta V} \cdot e' \quad \text{(Formula 12)}$$

<<Main Effect of Analog-to-Digital Converter According to this Embodiment>>

In the case of using the method described above, even though the attenuation rate of the attenuation circuit 21 varies from the design value a and becomes $a_{REAL}$, the input voltage ratio of the odd-numbered sample and the even-numbered sample adjacent to each other to the analog-to-digital conversion unit 23 becomes a constant value $a_{REAL}$. Here, in the method according to this embodiment, the attenuation rate estimation value (attenuation coefficient) $a_{EST}$ is also searched. For this reason, even though the attenuation rate of the attenuation circuit 21 becomes $a_{REAL}$, the attenuation rate estimation value $a_{EST}$ converges into $a_{REAL}$, an influence of the variation of the attenuation rate is absorbed, and accurate search of the correction coefficient $W_i$ can be maintained. As a result, if the attenuation circuit 21 has the superior linearity, a problem does not occur in particular, even though the attenuation rate varies from the design value. The linearity is sufficiently guaranteed in the attenuation circuit 21 using a passive element represented by a resistive voltage division circuit.

That is, in the method according to this embodiment, high-precision digital correction can be executed on non-linearity of the analog-to-digital conversion caused by the pipeline, cyclic, and successive comparison type analog-to-digital converters, without using an element requiring precision in particular. As a result, improvement of the conversion precision in the analog-to-digital converter can be realized. At this time, the internal circuit of the analog-to-digital conversion unit 23 does not need to be changed. Therefore, the high-precision digital correction can be executed on a commercially available analog-to-digital converter finished as a component. From a different point of view, when target conversion precision is realized, consumption power and a circuit area of the analog-to-digital converter can be greatly reduced.

Specifically, in the case of the pipeline analog-to-digital converter or the cyclic analog-to-digital converter, for example, because the high-precision digital correction is executed on the influence of the insufficient open loop gain and the non-linearity of the operational amplifier, an operational amplifier having low performance can be adopted. In addition, because the high-precision digital correction is also executed on an influence of the capacity value variation of the capacitive element or the direct-current offset voltage, a capacitive element having a small capacity value or a MOS transistor having a small gate width can be adopted. In addition, in the case of the successive comparison type analog-to-digital converter, because the high-precision digital correction is executed on the influence of the capacity value variation of the capacitive element or the direct-current offset voltage, the capacitive element having the small capacity value or the MOS transistor having the small gate width can be adopted. As a result, consumption power and a circuit area of the analog-to-digital converter can be greatly reduced.

In an example of FIG. 2B, the three cases of $V_1$, $V_2$, and $V_3$ are illustrated as the voltage variations of the correction signal, for convenience. However, at least the voltage variations equal to or larger than the number of searched coefficients are necessary. For example, when the correction coefficients $W_1$ to $W_{16}$ and the attenuation rate estimation value $a_{EST}$ are searched, at least 17 variations are necessary. However, in actuality, to search each correction coefficient with high precision, at least dozens of variations are preferably set. Here, a resistive voltage division circuit including a plurality of resistive elements is used as the attenuation circuit 21. However, a capacitive voltage division circuit configured by connecting a plurality of capacitive elements in series can be used, instead of the resistive voltage division circuit.

In addition, if the individual values of $V_1$, $V_2$, and $V_3$ in FIG. 2B are different values, the individual values can be arbitrarily determined in principle. As a condition of the voltage, the input voltage ratio of the odd-numbered sample and the even-numbered sample to the analog-to-digital conversion unit 23 needs to be maintained at the constant value a, in the example of FIG. 2B. The condition can be satisfied by constantly maintaining the voltages ($V_1$, $V_2$, and $V_3$) simply in the period of the odd-numbered sample and the period of the even-numbered sample subsequent to the period (that is, in each cycle of the correction signal), because it is guaranteed that the value of "a" is invariant.

Here, when the method illustrated FIG. 1 is used as a comparative example, V1'±Δ, V2'±Δ, V3'±Δ, . . . are input as the correction signal. At this time, similar to the method according to this embodiment, if individual values of V1', V2', V3', . . . are different values, the individual values can be arbitrarily determined, but a voltage value of Δ needs to be invariant. However, the correction signal is not easily generated in actuality. Particularly, when the correction signal is generated not inside the same chip as the analog-to-digital converter but outside the chip, it is thought that an analog addition circuit using an operational amplifier is used. However, in this case, an error may occur in a voltage value of 2Δ at the time of V1' and a voltage value of 2Δ at the time of V2', according to a distortion characteristic of the operational amplifier. Meanwhile, in the method according to this embodiment, instead of the voltage value "Δ", the attenuation rate (for example, a resistive voltage division ratio) "a" is used as a parameter in which invariance is necessary due to the various voltage variations. Therefore, the invariance can be easily guaranteed.

<<Modification of Correction Unit>>

In the correction unit 20a of FIG. 2A, the output of the odd-numbered sample-side digital correction unit 24 is multiplied with $a_{EST}$. However, the output of the even-numbered sample-side digital correction unit 25 may be multiplied with $a_{EST}$. In this case, a search value of $a_{EST}$ becomes a reciprocal 1/a of the attenuation rate a of the attenuation circuit 21, not the attenuation rate a. However, the desired correction coefficient $W_i$ can be searched in the same way. In this case, the search may be performed by algorithms of the following formulas (13) to (15), instead of the formulas (3) to (5).

[Mathematical Formula 13] (Formula 13)
$$e = a_{EST} \cdot D_{OUT}^{EVEN} - D_{OUT}^{ODD}$$

[Mathematical Formula 14] (Formula 14)
$$W_i^{(NEW)} = W_i^{(OLD)} - \mu_{Wi} \cdot e \cdot \left(\frac{1}{a} \cdot D_i^{EVEN} - D_i^{ODD}\right)$$

[Mathematical Formula 15] (Formula 15)
$$a_{EST}^{(NEW)} = a_{EST}^{(OLD)} - \mu_a \cdot e \cdot D_{OUT}^{EVEN}$$

<<Normal Operation of Analog-to-Digital Converter>>

The above description is the description when the analog-to-digital converter operates in the correction operation mode. In the correction operation mode, the control unit 30 of FIG. 2A performs selection of the path switching multiplexer (first selection circuit) 22 and causes the correction unit 20a to search the correction coefficient $W_i$, in a state in which the switch (input switch) 29 for the input path is controlled to OFF. The analog-to-digital converter according to this embodiment includes a normal operation mode in addition to the correction operation mode.

In the normal operation mode, the control unit 30 controls the switch 29 for the input path to ON and controls each switch in the path switching multiplexer 22 to OFF (that is, an output of the path switching multiplexer 22 is in an open state). As a result, the original input signal voltage (analog input voltage) $V_{IN}$ is input to the analog-to-digital conversion unit 23. The analog-to-digital conversion unit 23 executes analog-to-digital conversion on the input signal voltage $V_{IN}$ and obtains a corresponding digital output (digital signal) $D_i$ (i=1, 2, . . . , and M) of M bits. The correction unit 20a executes an operation of a formula (16) in the even-numbered sample-side digital correction unit 25, using the digital output $D_i$ and the correction coefficient value $W_i$ searched and obtained in the correction operation mode.

[Mathematical Formula 16] (Formula 16)

$$D_{OUT} = \sum_{i=1}^{M} W_i \cdot D_i$$

The even-numbered sample-side digital correction unit 25 executes the operation of the formula (16) on all of the samples, without depending on whether the sample is the odd-numbered sample or the even-numbered sample, and outputs (digital output signals after the correction) $D_{OUT}$ thereof become entire outputs of the digital correction type analog-to-digital converter at the time of the normal operation.

Figure 9:
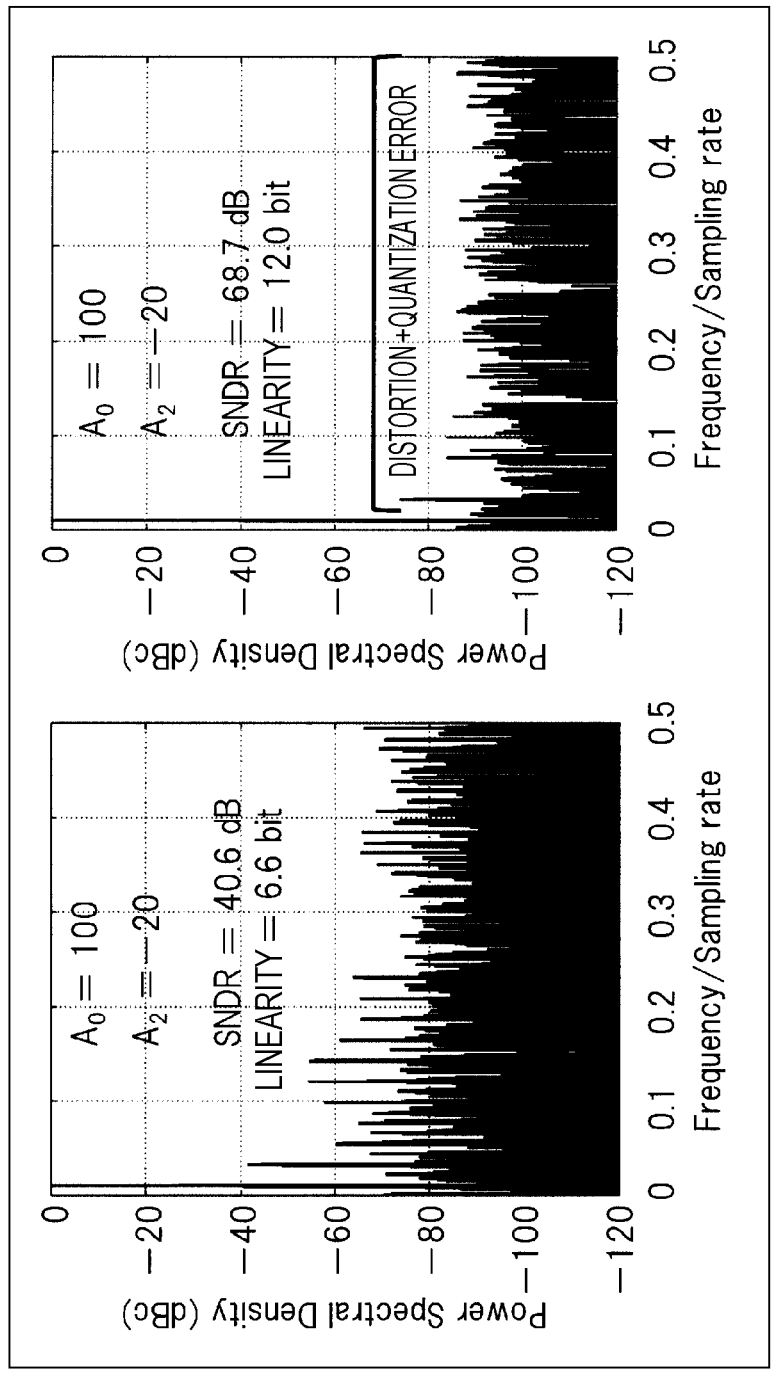
FIG. 9 is a diagram illustrating an example of a simulation result for the analog-to-digital converter of FIG. 2A and an example of a simulation result for a single body of an analog-to-digital conversion unit of FIG. 2A to be a comparative example.

FIG. 9 is a diagram illustrating an example of a simulation result for the analog-to-digital converter of FIG. 2A and an example of a simulation result for a single body of the analog-to-digital conversion unit of FIG. 2A to be a comparative example thereof. In this example, after a correction coefficient $W_i$ and a third-order distortion correction coefficient $B_3$ for 7 bits are searched using a pipeline analog-to-digital conversion unit 23 of 11 bit 1.5-bit/Stage, an output spectrum is observed using an input signal voltage $V_{IN}$ of a sine wave. When the digital correction is not executed (when the analog-to-digital conversion unit 23 is used as the single body), precision of the linearity is 6.6 bits. However, the precision of the linearity is improved to 12.0 bits by executing the digital correction using the method according to this embodiment. The above is only exemplary and the correction method according to this embodiment is effective to analog-to-digital converters having various resolutions.

As described above, the analog-to-digital converter according to the first embodiment executes the analog-to-digital conversion on each of a certain voltage and a voltage obtained by attenuating the certain voltage with a fixed attenuation rate, searches a correction coefficient of the analog-to-digital conversion unit, based on a conversion result and an adaptive control algorithm, and corrects a digital output of the analog-to-digital conversion unit using the searched correction coefficient. As a result, in the analog-to-digital converter executing the digital correction, conversion precision of about 13 bits or more can be realized without using a high-precision reference signal and applying a circuit change to the analog-to-digital conversion unit. In addition, the analog-to-digital conversion of the high speed/high precision/low consumption power can be realized in both cases of on-chip correction and on-board correction. That is, the analog-to-digital converter according to the first embodiment is particularly advantageous to the case of using the on-board correction to generate the "ADC input waveform" of FIG. 2B at the outside. However, the analog-to-digital converter according to the first embodiment is not limited thereto and is also advantageous to the case of using the on-board correction to generate the "ADC input waveform" in the analog-to-digital converter.

In FIG. 2B, the example of the case in which $V_1$ to $V_3$ are input in the odd-numbered samples and $aV_1$ to $aV_3$ are input in the even-numbered samples has been illustrated. However, the order of the inputs can be appropriately changed. For example, $V_1$ to $V_3$ may be input in the even-numbered samples and $aV_1$ to $aV_3$ may be input in the odd-numbered samples. In some cases, $V_1$ to $V_3$ may be sequentially input in continuous samples and $aV_1$ to $aV_3$ may be sequentially input in samples subsequent to the continuous samples. For example, if the correction unit 20a includes a memory to temporarily store the digital signals from the analog-to-digital conversion unit 23, a search process can be executed with $V_1$ and $aV_1$ as a pair, without depending on the input order of the digital signals for $V_1$ to $V_3$ and $aV_1$ to $aV_3$ from the analog-to-digital conversion unit 23. However, at this time, a value of $V_1$ needs to be invariant, when $V_1$ is input to the analog-to-digital conversion unit 23 and when $aV_1$ is input, as described above.

Here, the method of searching the attenuation rate estimation value (attenuation coefficient) $a_{EST}$ is used. However, a fixed value can be used in some cases. Specifically, if the variation of the attenuation rate a of the attenuation circuit 21 can be controlled with high precision, $a_{EST}$ can be set to a fixed value. In this case, because the searched coefficients decrease, the search speed can be increased. However, in actuality, it is not easy to control the variation of each passive element (resistor or a capacitor) configuring the attenuation circuit 21. Particularly, when the on-board correction is executed, the difficulty increases. For this reason, a method of searching $a_{EST}$ is preferably used.

Second Embodiment

Correction Signal Generation Method [1]

Figure 3A:
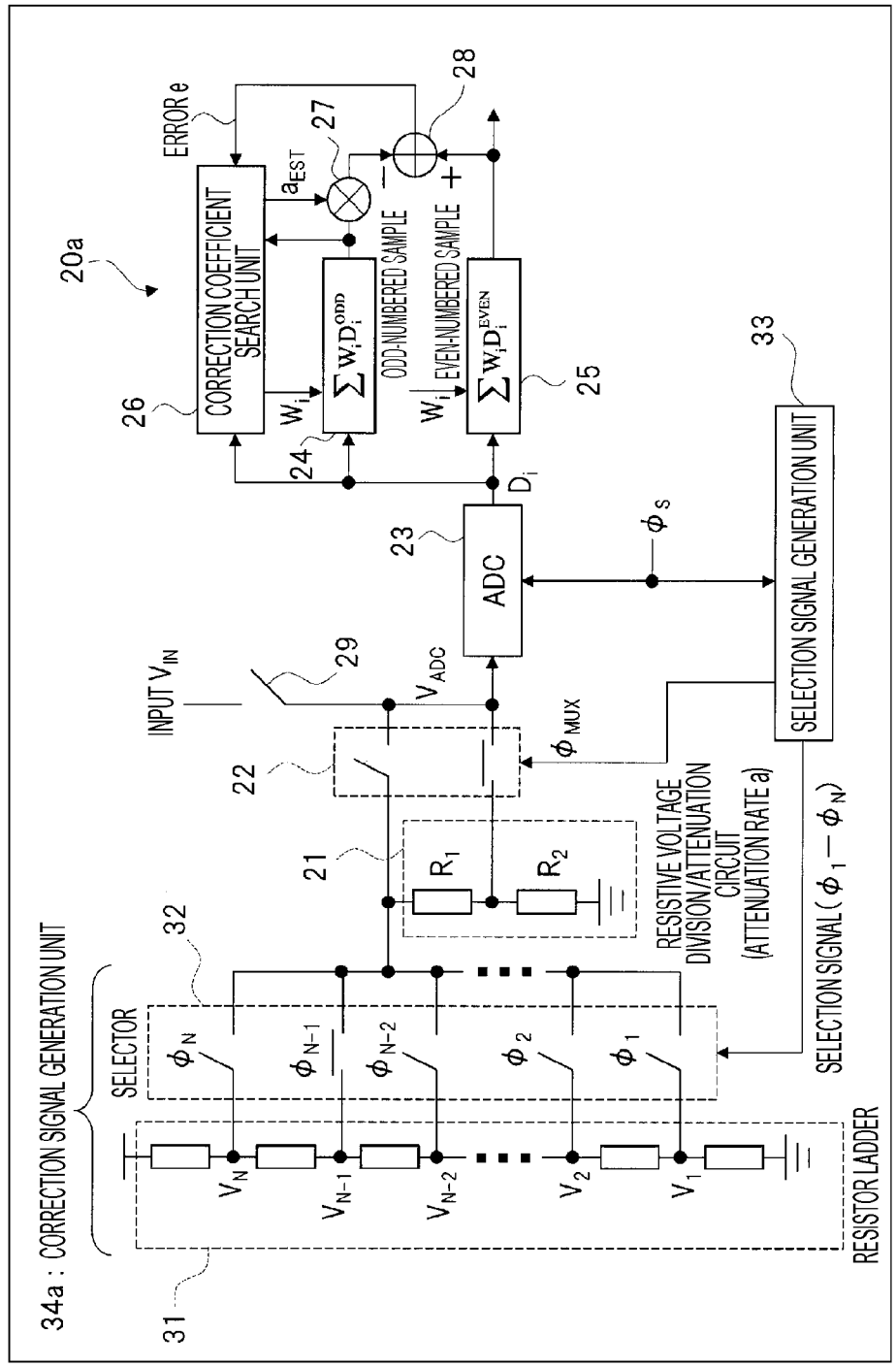
FIG. 3A is a schematic diagram illustrating a configuration example of an analog-to-digital converter according to a second embodiment of the present invention.
Figure 3B:
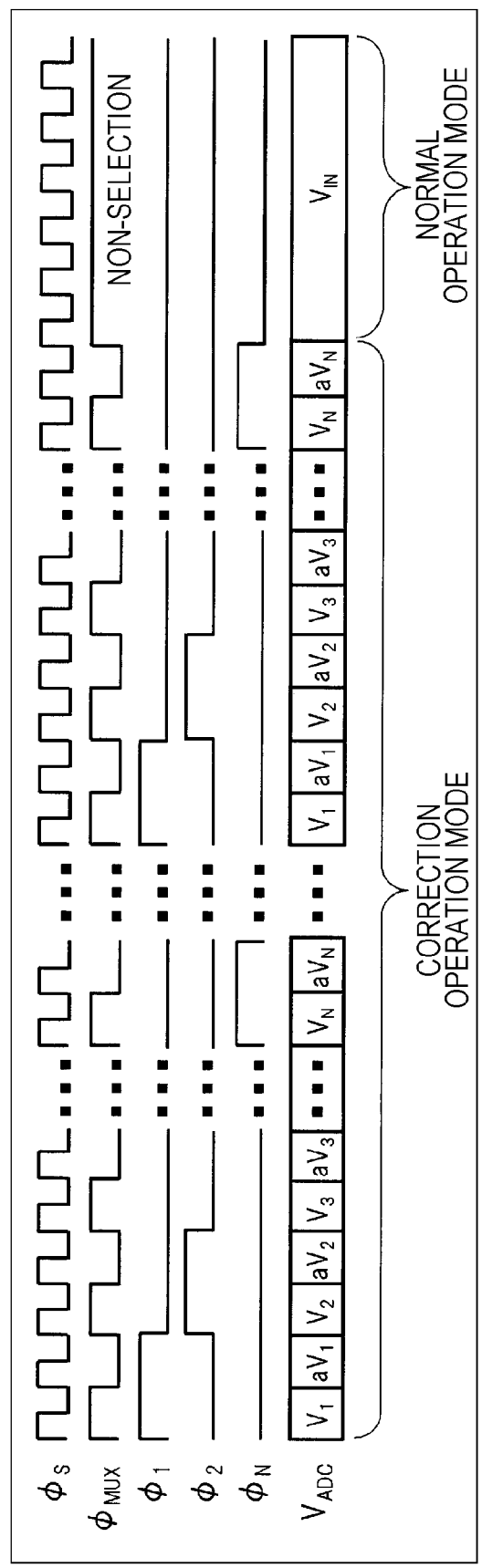
FIG. 3B is a timing chart illustrating an operation example of a main portion in FIG. 3A.

FIG. 3A is a schematic diagram illustrating a configuration example of an analog-to-digital converter according to a second embodiment of the present invention. FIG. 3B is a timing chart illustrating an operation example of a main portion in FIG. 3A. In the analog-to-digital converter of FIG. 3A, a method of generating a correction signal is illustrated in detail as compared with the configuration example of FIG. 2A. Because configurations and operations of an analog-to-digital conversion unit 23 and a correction unit 20a of a rear step thereof are the same as those in FIGS. 2A and 3A, the detailed description thereof is omitted.

In FIG. 3A, N outputs in N resistive voltage division nodes of a ladder resistor type multi-voltage generation unit (resistive voltage division circuit for correction) 31 are input to a selector (second selection circuit) 32 and an output node of the selector 32 becomes the correction signal application terminal described in the first embodiment. That is, the output node of the selector 32 is connected to an attenuation circuit 21 and the output node of the selector 32 and an output node of the attenuation circuit 21 are connected to two input nodes of a path switching multiplexer 22, respectively. An output of the path switching multiplexer 22 is input to the analog-to-digital conversion unit 23.

The attenuation circuit 21 is configured by resistive elements having resistance values of $R_1$ and $R_2$ and becomes a resistive voltage division circuit realizing an attenuation rate of $R_2/(R_1+R_2)$, as illustrated in FIG. 3A. In addition, a selection signal of the selector 32 and a path switching signal of the path switching multiplexer 22 are generated by a selection signal generation unit 33. An original input signal voltage $V_{IN}$ for the analog-to-digital conversion unit 23 is input to the analog-to-digital conversion unit 23 via a switch 29 for an input path.

The ladder resistor type multi-voltage generation unit 31 has a structure in which (N+1) resistive elements connected in series are inserted between a power supply voltage and a ground. As illustrated in FIG. 3A, N voltages $V_1$ to $V_N$ are generated in the N resistive voltage division nodes, according to resistance values of the individual resistive elements. The selector 32 selects one voltage by selection signals $\phi 1$ to $\phi N$ from a selection signal generation unit 33. As a result, a stepwise correction signal waveform illustrated in FIG. 2B is generated in the output node of the selector 32. In addition, the ladder resistor type multi-voltage generation unit 31 and the selector 32 configure a correction signal generation unit 34a.

When a correction signal has a stepwise waveform illustrated in FIG. 2B, for example, the resistance values of the individual resistive elements in the ladder resistor type multi-voltage generation unit 31 may be set equally, the selection signals $\phi 1$ to $\phi N$ may be sequentially activated, and these may be circulated. For this reason, as illustrated in the timing chart of FIG. 3B, the selection signals $\phi 1$ to $\phi N$ have a high voltage sequentially and repetitively and a corresponding switch in the selector 32 is controlled to ON. A period in which each selection signal has the high voltage is set to two conversion cycles of a clock (sampling clock) $\phi s$ for conversion in the analog-to-digital conversion unit 23, so that a correction signal waveform in which a voltage value is accurately held by two cycles can be generated, similar to the case of the first embodiment. A path switching signal $\phi_{MUX}$ of the path switching multiplexer 22 can be generated by dividing the clock $\phi s$ for conversion in the analog-to-digital conversion unit 23 by 2, in the selection signal generation unit 33.

In the timing chart of FIG. 3B, when the path switching signal $\phi_{MUX}$ has a high voltage, an upper switch of the path switching multiplexer 22 is turned on and the output voltages $V_1$ to $V_N$ of the selector 32 are applied as an input voltage $V_{ADC}$ to the analog-to-digital conversion unit 23. Meanwhile, when the path switching signal $\phi_{MUX}$ has a low voltage, a lower switch of the path switching multiplexer 22 is turned on and output voltages $aV_1$ to $aV_N$ of the attenuation circuit 21 are applied as the input voltage $V_{ADC}$ to the analog-to-digital conversion unit 23. Even though the output voltages $V_1$ to $V_N$ of the ladder resistor type multi-voltage generation unit 31 vary from a design value, this does not affect correction precision by the correction unit 20a in particular. For this reason, even though the resistance value of each resistive element varies to some degree, a problem does not occur in particular.

After the analog-to-digital converter operates in the correction operation mode, the analog-to-digital converter operates in the normal operation mode. In the normal operation mode, the switch 29 for the input path is turned on and each switch in the selector 32 and each switch in the path switching multiplexer 22 are turned off. That is, the output node of the path switching multiplexer 22 enters an open state. As a result, as illustrated in the timing chart of FIG. 3B, the original input signal voltage $V_{IN}$ becomes the input voltage $V_{ADC}$ to the analog-to-digital conversion unit 23.

The analog-to-digital converter according to the second embodiment is used as described above, so that the correction signal can be easily generated by providing the correction signal generation unit 34a including the ladder resistor type multi-voltage generation unit 31 and the selector 32, in addition to the various effects described in the first embodiment.

Third Embodiment

Correction Signal Generation Method [2]

Figure 4A:
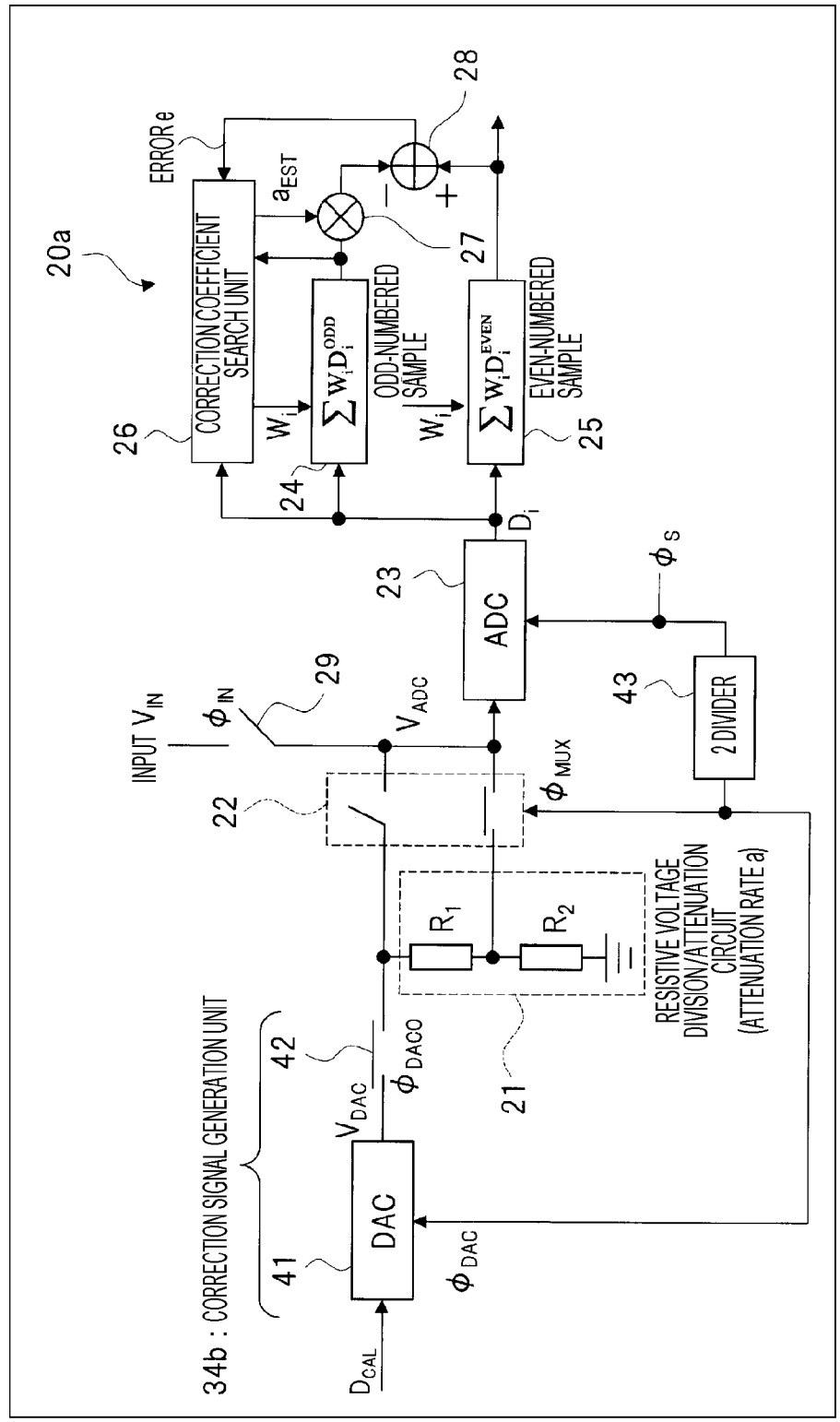
FIG. 4A is a schematic diagram illustrating a configuration example of an analog-to-digital converter according to a third embodiment of the present invention.
Figure 4B:
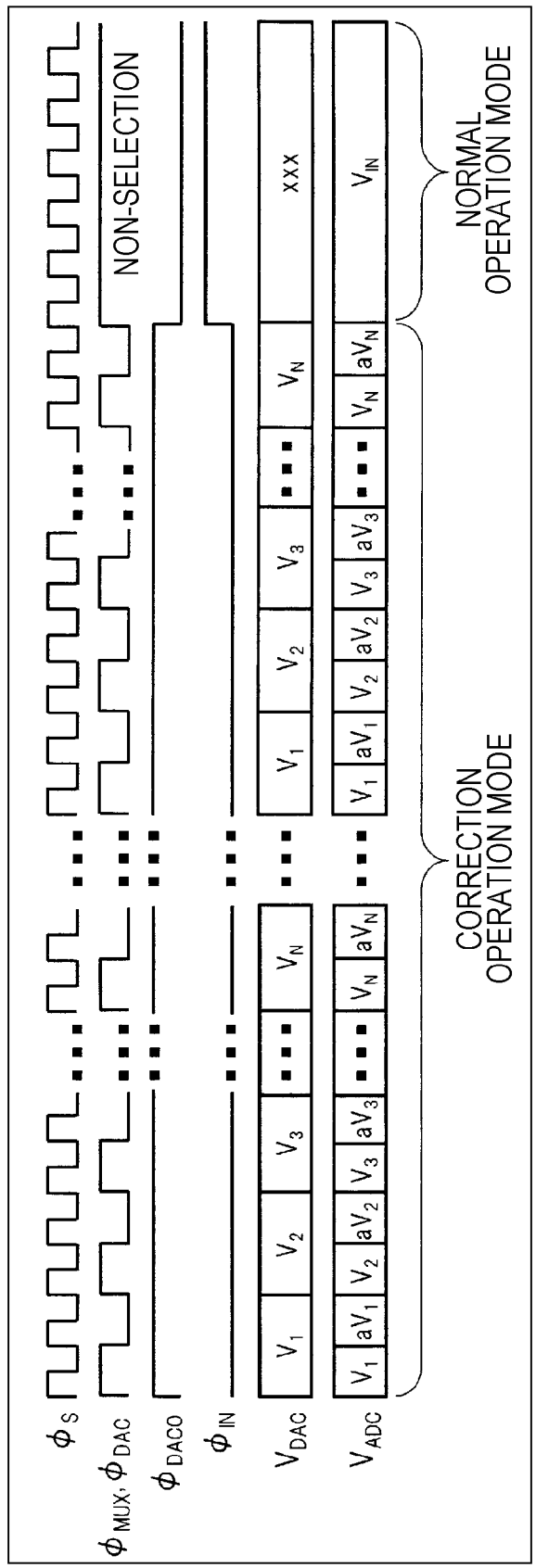
FIG. 4B is a timing chart illustrating an operation example of a main portion in FIG. 4A.

FIG. 4A is a schematic diagram illustrating a configuration example of an analog-to-digital converter according to a third embodiment of the present invention. FIG. 4B is a timing chart illustrating an operation example of a main portion in FIG. 4A. In the analog-to-digital converter of FIG. 4A, a method of generating a correction signal is illustrated in detail as compared with the configuration example of FIG. 2A. Because configurations and operations of an analog-to-digital conversion unit 23 and a correction unit 20a of a rear step thereof are the same as those in FIGS. 2A and 4A, the detailed description thereof is omitted.

In FIG. 4A, a digital signal $D_{CAL}$ for correction is input to a digital-to-analog conversion unit (DAC) 41 and an output voltage $V_{DAC}$ of the digital-to-analog conversion unit 41 is applied as a correction signal via a switch 42 for a DAC path. A node of a right end of the switch 42 for the DAC path becomes the correction signal application terminal in the first embodiment. That is, the node of the right end of the switch 42 for the DAC path is connected to an attenuation circuit 21 and the node of the right end of the switch 42 for the DAC path and an output node of the attenuation circuit 21 are connected to two input nodes of a path switching multiplexer 22, respectively. An output of the path switching multiplexer 22 is input to the analog-to-digital conversion unit 23. In addition, the digital-to-analog conversion unit 41 and the switch 42 for the DAC path configure a correction signal generation unit 34b.

The attenuation circuit 21 is configured by resistive elements having resistance values of $R_1$ and $R_2$ and becomes a resistive voltage division circuit realizing an attenuation rate of $R_2/(R_1+R_2)$, as illustrated in FIG. 4A. A clock (sampling clock) $\phi_{DAC}$ for conversion in the digital-to-analog conversion unit 41 and path switching signal $\phi_{MUX}$ of the path switching multiplexer 22 can be generated by dividing a clock (sampling clock) $\phi s$ for conversion in the analog-to-digital conversion unit 23 by 2 by a 2 divider 43. The digital-to-analog conversion unit 41 has a property that an output voltage is held, in one conversion cycle thereof. For this reason, a frequency of the clock $\phi_{DAc}$ for the conversion is set as 1/2 of the clock $\phi s$ for the conversion in the analog-to-digital conversion unit 23, so that correction signal waveforms $V_1$ to $V_N$ in which a voltage value is accurately held by two cycles of $\phi s$ can be generated, similar to the case of the first embodiment.

As a result, in the timing chart of FIG. 4B, when the path switching signal $\phi_{MUX}$ has a high voltage, an upper switch of the path switching multiplexer 22 is turned on and the output voltages $V_1$ to $V_N$ of the digital-to-analog conversion unit 41 are applied as an input voltage $V_{ADC}$ to the analog-to-digital conversion unit 23. Meanwhile, when the path switching signal $\phi_{MUX}$ has a low voltage, a lower switch of the path switching multiplexer 22 is turned on and output voltages $aV_1$ to $aV_N$ of the attenuation circuit 21 are applied as the input voltage $V_{ADC}$ to the analog-to-digital conversion unit 23. In a period of a correction operation mode, the switch 42 for the DAC path is controlled to ON by a DAC path conduction signal $\phi_{DACO}$.

Meanwhile, in a normal operation mode, a switch 29 for an input path is turned on by a control signal $\phi_{IN}$ and each switch in the switch 42 for the DAC path and the path switching multiplexer 22 is turned off. That is, an output node of the path switching multiplexer 22 enters an open state. As a result, as illustrated in the timing chart of FIG. 4B, an original input signal voltage $V_{IN}$ becomes the input voltage $V_{ADC}$ to the analog-to-digital conversion unit 23.

The analog-to-digital converter according to the third embodiment is used as described above, so that the correction signal can be easily generated by using the digital-to-analog conversion unit 41, in addition to the various effects described in the first embodiment. At this time, even though an output voltage of the digital-to-analog conversion unit 41 varies from a design value to some degree, a problem does not occur in particular. Each output voltage may be maintained constantly in one conversion cycle of $\phi_{DAC}$. Therefore, a digital-to-analog conversion unit having low precision can be applied. In addition, when this embodiment is applied to a system including a microcomputer and the like, the digital-to-analog conversion unit mounted in the microcomputer is used, so that addition of a component caused by the correction signal generation unit 34b becomes unnecessary in particular.

Fourth Embodiment

Correction Signal Generation Method [3]

Figure 5A:
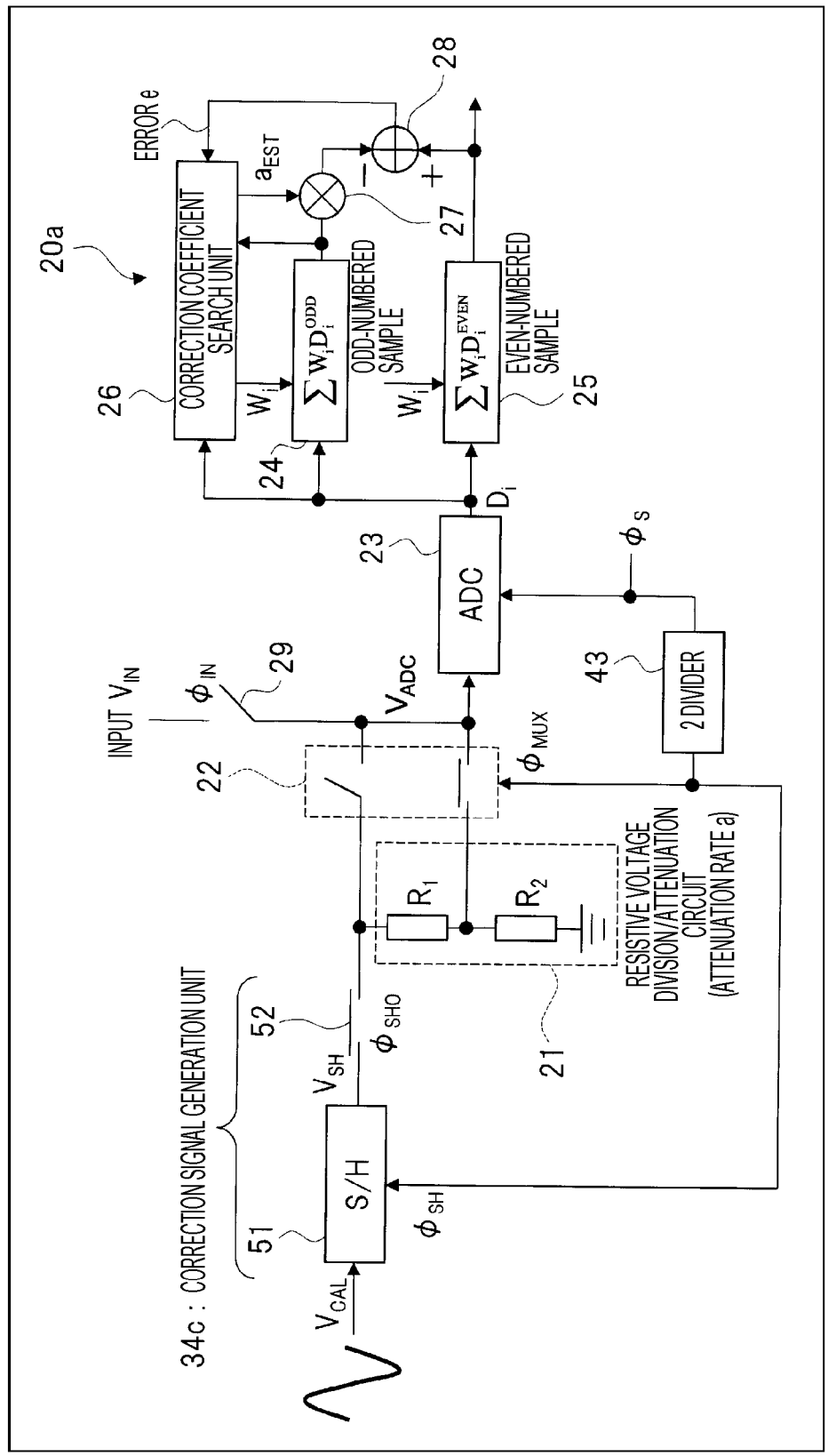
FIG. 5A is a schematic diagram illustrating a configuration example of an analog-to-digital converter according to a fourth embodiment of the present invention.
Figure 5B:
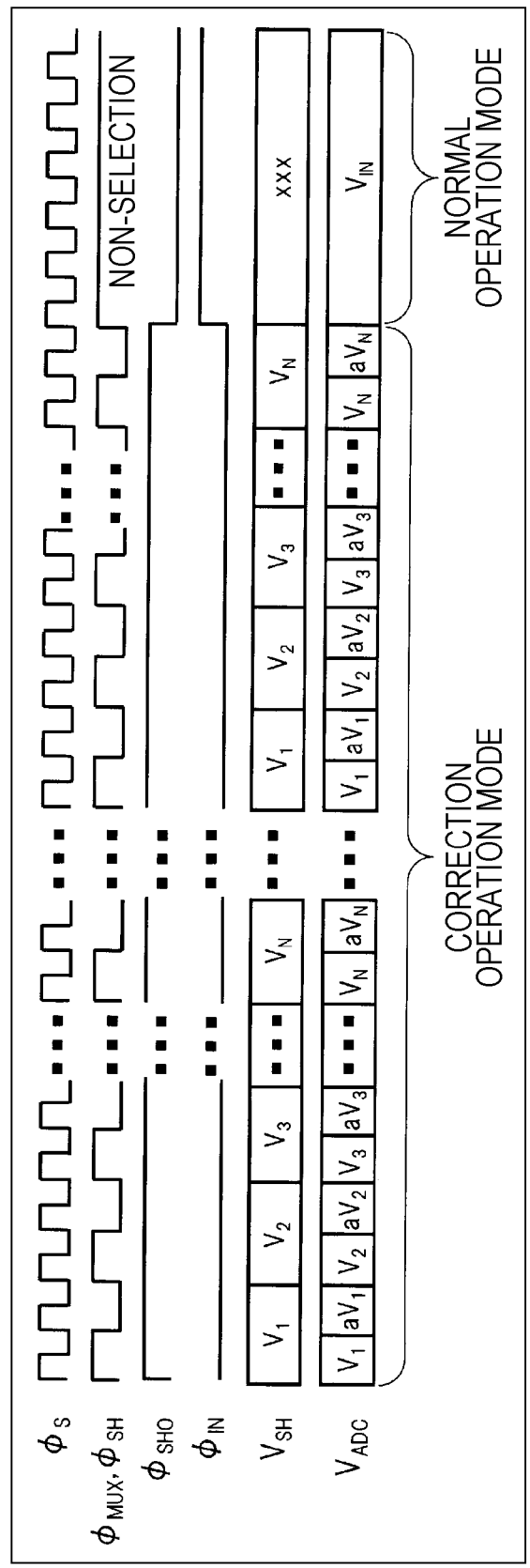
FIG. 5B is a timing chart illustrating an operation example of a main portion in FIG. 5A.

FIG. 5A is a schematic diagram illustrating a configuration example of an analog-to-digital converter according to a fourth embodiment of the present invention. FIG. 5B is a timing chart illustrating an operation example of a main portion in FIG. 5A. In the analog-to-digital converter of FIG. 5A, a method of generating a correction signal is illustrated in detail as compared with the configuration example of FIG. 2A. Because configurations and operations of an analog-to-digital conversion unit 23 and a correction unit 20a of a rear step thereof are the same as those in FIGS. 2A and 5A, the detailed description thereof is omitted.

In FIG. 5A, an analog signal $V_{CAL}$ for correction such as a sine wave is input to a sample-and-hold circuit (S/H) 51 and an output voltage $V_{SH}$ of the sample-and-hold circuit 51 is applied as a correction signal via a switch 52 for an S/H path. A node of a right end of the switch 52 for the S/H path becomes the correction signal application terminal described in the first embodiment. That is, the node of the right end of the switch 52 for the S/H path is connected to an attenuation circuit 21 and the node of the right end of the switch 52 for the S/H path and an output node of the attenuation circuit 21 are connected to two input nodes of a path switching multiplexer 22, respectively. An output of the path switching multiplexer 22 is input to the analog-to-digital conversion unit 23. In addition, the sample-and-hold circuit 51 and the switch 52 for the S/H path configure a correction signal generation unit 34c.

The attenuation circuit 21 is configured by resistive elements having resistance values of $R_1$ and $R_2$ and becomes a resistive voltage division circuit realizing an attenuation rate of $R_2/(R_1+R_2)$, as illustrated in FIG. 5A. A clock $\phi_{SH}$ for an operation in the sample-and-hold circuit 51 and a path switching signal $\phi_{MUX}$ of the path switching multiplexer 22 can be generated by dividing a clock $\phi$s for conversion in the analog-to-digital conversion unit 23 by 2 by a 2 divider 43. The sample-and-hold circuit 51 has a property that an output voltage is held, in one conversion cycle (strictly, a period obtained by removing a sampling period from one conversion cycle) thereof. For this reason, a frequency of the clock $\phi_{SH}$ for the operation is set as 1/2 of the clock (sampling clock) $\phi$s for the conversion in the analog-to-digital conversion unit 23, so that correction signal waveforms $V_1$ to $V_N$ in which a voltage value is accurately held by two cycles can be generated, similar to the case of the first embodiment.

As a result, in the timing chart of FIG. 5B, when the path switching signal $\phi_{MUX}$ has a high voltage, an upper switch of the path switching multiplexer 22 is turned on and the output voltages $V_1$ to $V_N$ of the sample-and-hold circuit 51 are applied as an input voltage $V_{ADC}$ to the analog-to-digital conversion unit 23. Meanwhile, when the path switching signal $\phi_{MUX}$ has a low voltage, a lower switch of the path switching multiplexer 22 is turned on and output voltages $aV_1$ to $aV_N$ of the attenuation circuit 21 are applied as the input voltage $V_{ADC}$ to the analog-to-digital conversion unit 23. In a period of a correction operation mode, the switch 52 for the S/H path is controlled to ON by an S/H path conduction signal $\phi_{SHO}$.

Meanwhile, in a normal operation mode, a switch 29 for an input path is turned on by a control signal (PIN and the switch 52 for the S/H path and each switch in the path switching multiplexer 22 are turned off. That is, an output node of the path switching multiplexer 22 enters an open state. As a result, as illustrated in the timing chart of FIG. 5B, an original input signal voltage $V_{IN}$ becomes the input voltage $V_{ADC}$ to the analog-to-digital conversion unit 23.

The analog-to-digital converter according to the fourth embodiment is used as described above, so that the correction signal can be easily generated by using the sample-and-hold circuit 51, in addition to the various effects described in the first embodiment. At this time, even though an output voltage of the sample-and-hold circuit 51 varies from a design value to some degree, a problem does not occur in particular. Each output voltage may be maintained constantly in one conversion cycle of $\phi_{SH}$. Therefore, a sample-and-hold circuit having low precision can be applied.

Fifth Embodiment

Correction Signal Generation Method [4]

Figure 6:
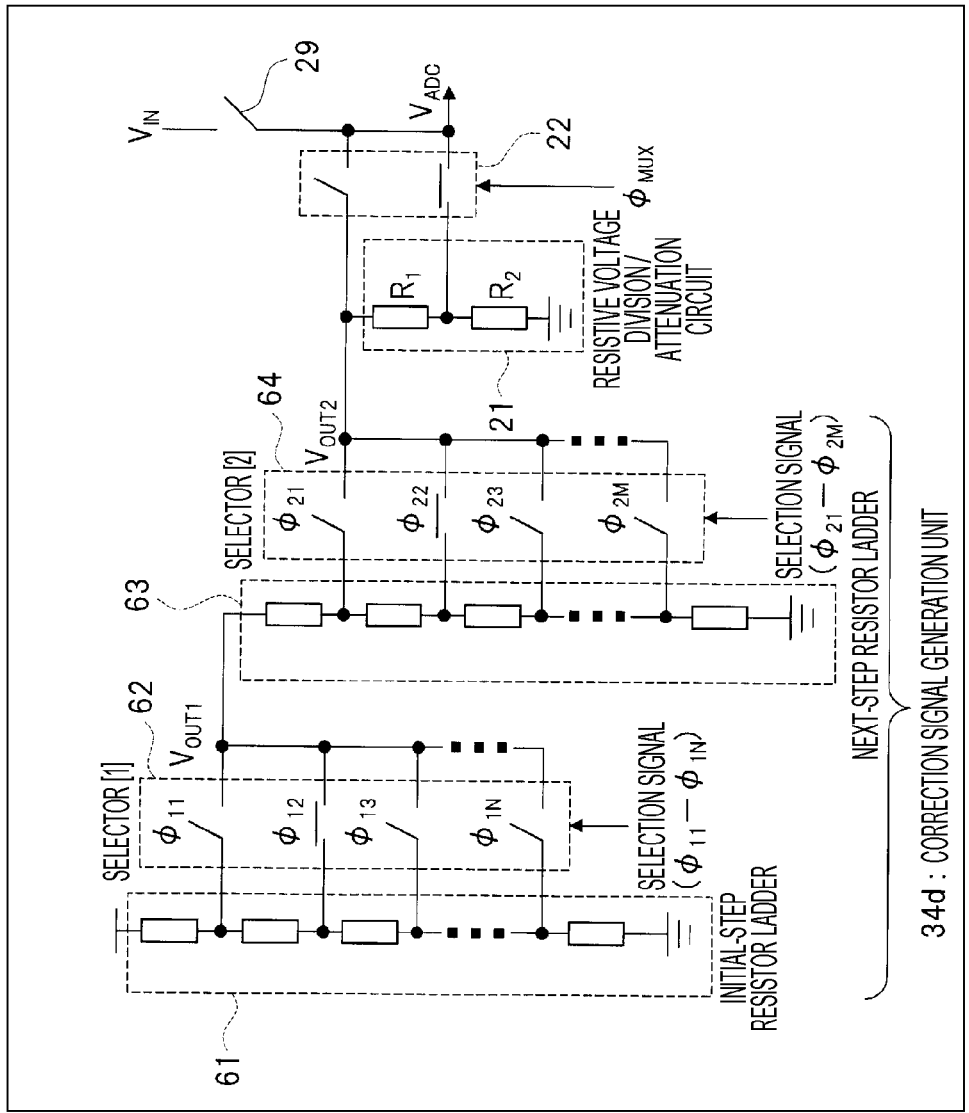
FIG. 6 is a schematic diagram illustrating a configuration example of a correction signal generation unit included in an analog-to-digital converter according to a fifth embodiment of the present invention.

FIG. 6 is a schematic diagram illustrating a configuration example of a correction signal generation unit included in an analog-to-digital converter according to a fifth embodiment of the present invention. A correction signal generation unit 34d illustrated in FIG. 6 has a ladder resistor type configuration and becomes a modification of the correction signal generation unit 34a according to the second embodiment illustrated in FIG. 3A.

In FIG. 6, N outputs from N resistive voltage division nodes included in an initial-step ladder resistor 61 are input to a selector [1] 62 and an output voltage $V_{OUT1}$ thereof is input as a voltage of an upper end of a next-step ladder resistor 63. M outputs from M resistive voltage division nodes included in the next-step ladder resistor 63 are input to a selector [2] 64 and an output voltage $V_{OUT2}$ thereof becomes the voltage of the correction signal described in the first embodiment.

The initial-step ladder resistor 61 has a structure in which (N+1) resistive elements connected in series are inserted between a power supply voltage and a ground. As illustrated in FIG. 6, N voltages are generated in the N resistive voltage division nodes, according to resistance values of the individual resistive elements. The selector [1] 62 selects one voltage by selection signals $\phi_{11}$ to $\phi_{1N}$, so that the output voltage $V_{OUT1}$ is obtained. The next-step ladder resistor 63 has a structure in which (M+1) resistive elements connected in series are inserted between $V_{OUT1}$ and the ground. By this structure, M voltages are generated based on the output voltage $V_{OUT1}$ selected by the selector [1] 62 and the selector [2] 64 selects one voltage by selection signals $\phi_{21}$ to $\phi_{2M}$.

Therefore, the output voltage $V_{OUT2}$ of the selector [2] 64 can take (N×M) values. For this reason, the number of resistive elements necessary for realizing the number of voltage variations required in the correction signal can be reduced as compared with the case of the second embodiment. In addition, the selection signals $\phi_{11}$ to $\phi_{1N}$ or $\phi_{21}$ to $\phi_{2M}$ may be appropriately controlled such that the output voltage $V_{OUT2}$ becoming the correction signal becomes a stepwise voltage held by two cycles of an analog-to-digital conversion cycle, similar to other embodiments. Here, a lower end of the next-step ladder resistor 63 is grounded. However, the lower end of the next-step ladder resistor 63 may be connected selectively to the N resistive voltage division nodes of the initial-step ladder resistor 61. That is, the same selector as the selector [1] 62 is provided separately and a voltage between the adjacent resistive voltage division nodes of the initial-step ladder resistor 61 is further divided by the next-step ladder resistor 63.

Sixth Embodiment

Correction Signal Generation Method [5]

Figure 7:
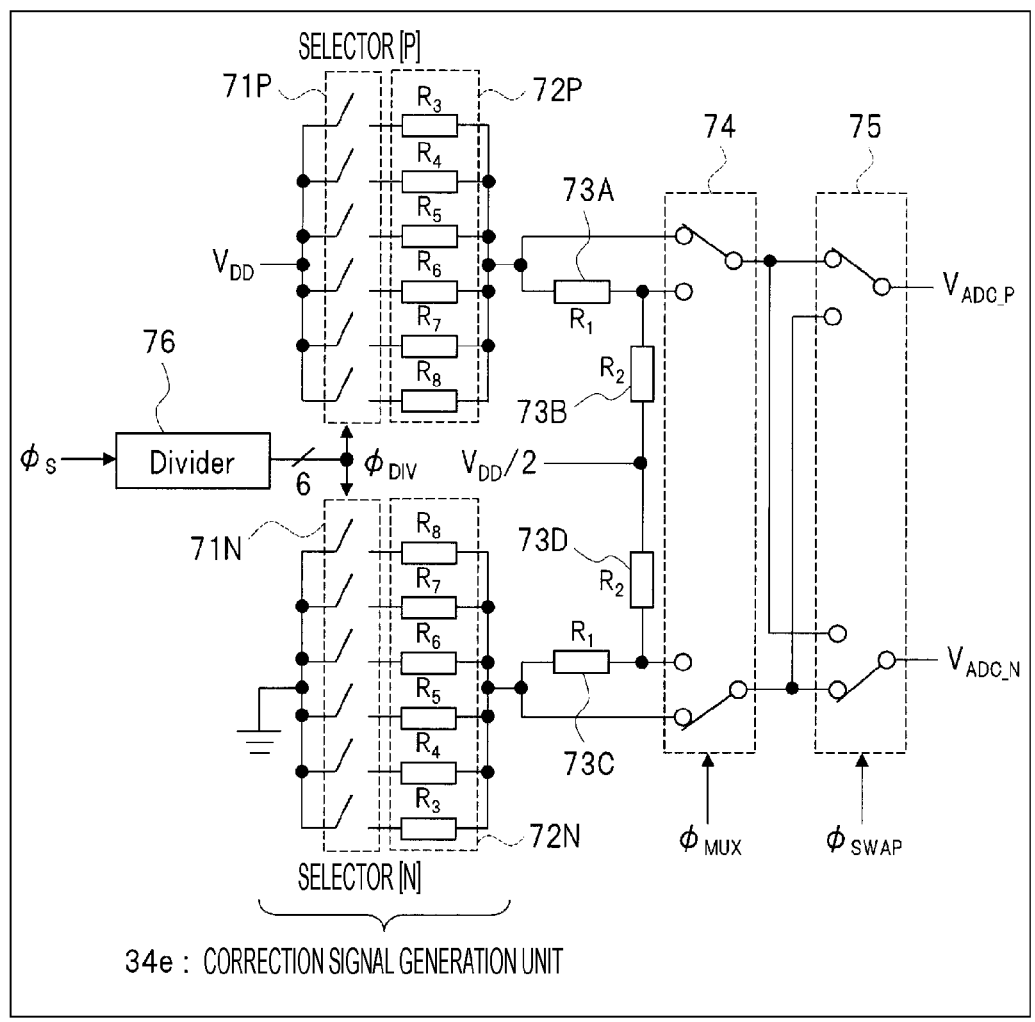
FIG. 7 is a schematic diagram illustrating a configuration example of a surrounding portion of a correction signal generation unit included in an analog-to-digital converter according to a sixth embodiment of the present invention.

FIG. 7 is a schematic diagram illustrating a configuration example of a surrounding portion of a correction signal generation unit included in an analog-to-digital converter according to a sixth embodiment of the present invention. A correction signal generation unit 34e illustrated in FIG. 7 has a ladder resistor type configuration and becomes a modification of the correction signal generation unit 34a according to the second embodiment illustrated in FIG. 3A. Here, different from the case of FIG. 3A, an example of the case in which an analog-to-digital conversion unit 23 has a differential circuit configuration is illustrated.

In FIG. 7, a selector [P] (third selection circuit) 71P connected to a power supply voltage $V_{DD}$ and a parallel resistor [P] 72P connected to each output thereof generate a correction signal of a normal phase side. In addition, a selector [N] (third selection circuit) 71N connected to a ground and a parallel resistor [N] 72N connected to an output thereof generate a correction signal of a reverse phase side. A difference of a voltage of the correction signal of the normal phase side and a voltage of the correction signal of the reverse phase side becomes the voltage of the correction signal in the first embodiment. The correction signal of the normal phase side is input to a resistive voltage division type attenuation circuit including a resistor [A] 73A and a resistor [B] 73B for the attenuation circuit and an upper input node of the normal phase side of a path switching multiplexer 74. Likewise, the correction signal of the reverse phase side is input to a resistive voltage division type attenuation circuit including a resistor [C] 73C and a resistor [D] 73D for the attenuation circuit and a lower input node of the normal phase side of the path switching multiplexer 74.

A voltage of 1/2 of the power supply voltage, that is, $V_{DD}/2$ is applied to the other ends of the attenuation circuit of the normal phase side and the attenuation circuit of the reverse phase side. As a result, a common mode voltage (average voltage) of a differential signal for correction can be maintained at $V_{DD}/2$. An output node of the attenuation circuit of the normal phase side is connected to the lower input node of the normal phase side of the path switching multiplexer 74. Likewise, an output of the attenuation circuit of the reverse phase side is connected to the upper input node of the reverse phase side of the path switching multiplexer 74. In addition, an output node of the normal phase side of the path switching multiplexer 74 is connected to an upper input node of a normal phase side and an upper input node of a reverse phase side of a multiplexer 75 for inversion. Likewise, an output node of the reverse phase side of the path switching multiplexer 74 is connected to a lower input node of the reverse phase side and a lower input node of the normal phase side of the multiplexer 75 for the inversion.

A voltage difference of an output voltage $V_{ADC\_P}$ of the normal phase side and an output voltage $V_{ADC\_N}$ of the reverse phase side of the multiplexer 75 for the inversion becomes a differential input voltage $V_{ADC}$ to the analog-to-digital conversion unit 23. Here, the example of the case in which the analog-to-digital conversion unit has the differential circuit configuration is described. However, the present invention can be applied to the case in which the analog-to-digital conversion unit has a single circuit configuration. In this case, the multiplexer 75 for the inversion may be omitted, only each circuit of the normal phase side may be provided, and the other end of the attenuation circuit of the normal phase side may be grounded.

Here, although not limited in particular, it is assumed that the resistors [A] 73A, [B] 73B, [C] 73C, and D [73D] for the attenuation circuit have the same resistance values. In this case, an attenuation rate of the attenuation circuit becomes 1/2. In addition, although not limited in particular, it is assumed that each of the parallel resistor [P] 72P and the parallel resistor [N] 72N includes six resistors ($R_3$ to $R_8$) including a combination of the same resistance values and resistance values of $R_4$, $R_5$, $R_6$, $R_7$, and $R_8$ are 2 times, 4 times, 8 times, 16 times, and 32 times as large as a resistance value of $R_3$, respectively.

A clock $\phi_s$ for conversion in the analog-to-digital conversion unit 23 (not illustrated in the drawings) is input to a divider 76 and ON/OFF of 6 selection switches in each of the selector [P] 71P and the selector [N] 71N is controlled by division outputs $\phi_{DIV}$ of 4 division, 8 division, 16 division, 32 division, 64 division, and 128 division of the divider 76, respectively. The parallel resistance value of the normal phase side and the parallel resistance value of the reverse phase side are controlled by the above control to become the same value $R_{EFF}$. As a result, the voltage of the differential signal for the correction becomes "$V_{DD} \times 2R/(R_{EFF}+2R)$". At this time, $R_{EFF}$ sequentially changes like the same resistance value as the resistance value of $R_3$ and 2 times, 3 times, . . . , and 64 times as large as the resistance value of $R_3$, according to control by $\phi_{DIV}$. As a result, 64 voltage variations are obtained as the differential signal for the correction and the number of voltage variations sufficient for searching a correction coefficient $W_i$ correctly is obtained.

In addition, the multiplexer 75 for the inversion is provided to obtain a positive/negative voltage of a correction signal and improve the searching ability of the correction coefficient $W_i$. That is, the whole of an input range of the differential signal of the analog-to-digital conversion unit 23, not the half, is covered and the correction coefficient $W_i$ is searched. When an inversion control signal $\phi_{SWAP}$ of the multiplexer 75 for the inversion has a high voltage, the upper node of the normal phase side and the lower node of the reverse phase side are selected by the multiplexer 75 for the inversion and the voltage of the differential signal for the correction is output as it is. For this reason, a voltage of a final correction signal is a positive voltage. Meanwhile, when the inversion control signal $\phi_{SWAP}$ has a low voltage, the lower node of the normal phase side and the upper node of the reverse phase side are selected by the multiplexer 75 for the inversion and the voltage of the differential signal for the correction is inverted and output. For this reason, a voltage of a final correction signal is a negative voltage. The path switching signal $\phi_{MUX}$ of the path switching multiplexer 74 can be generated by dividing the clock $\phi_s$ for the conversion in the analog-to-digital conversion unit 23 by 2, similar to the second embodiment.

By using the configuration illustrated in FIG. 7, the number of resistive elements necessary for realizing the number of voltage variations required in the correction signal can be reduced as compared with the case of the second embodiment, similar to the case of the fifth embodiment.

Seventh Embodiment

Schematic Configuration of Analog-to-Digital Converter (Modification [1])

Figure 8:
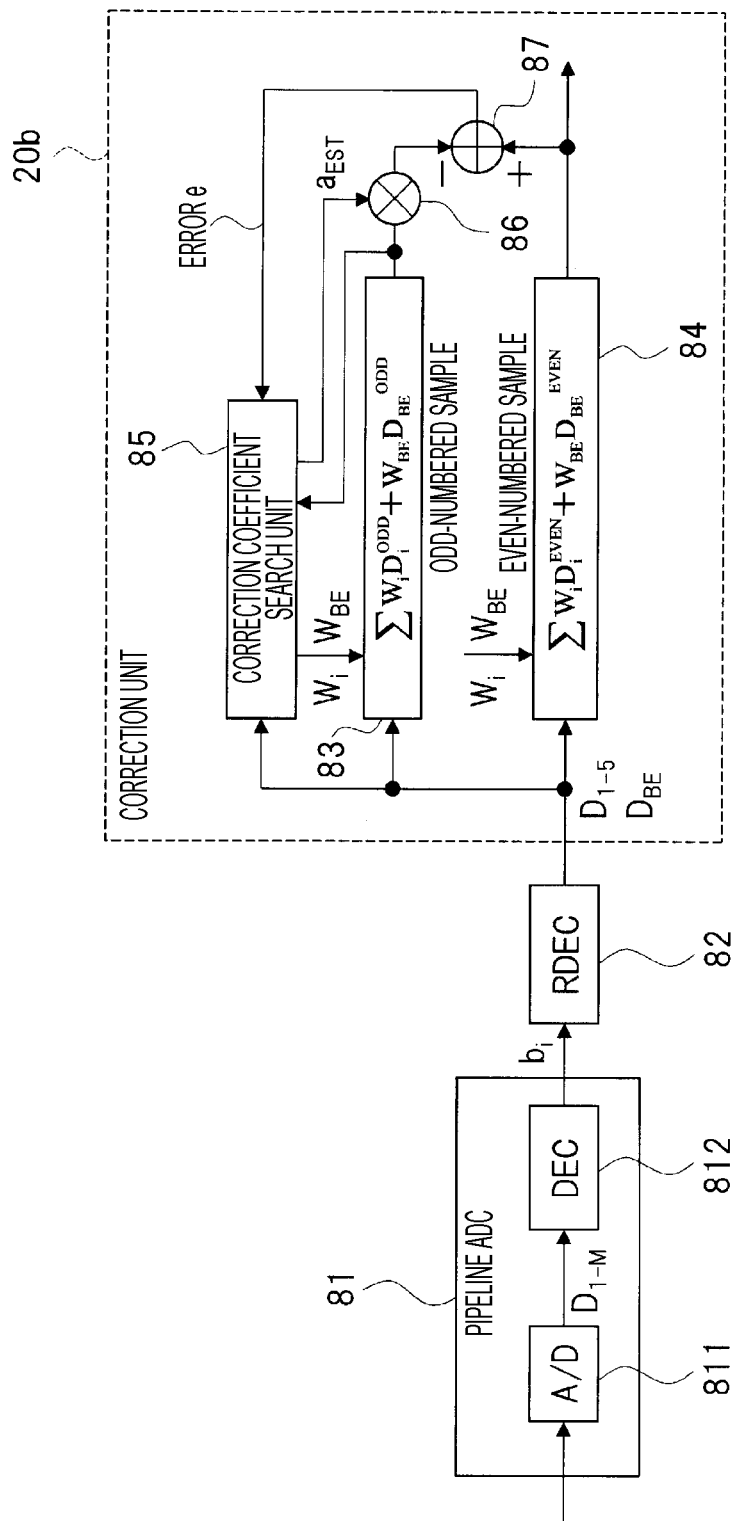
FIG. 8 is a schematic diagram illustrating a configuration example of a part of an analog-to-digital converter according to a seventh embodiment of the present invention.

FIG. 8 is a schematic diagram illustrating a configuration example of a part of an analog-to-digital converter according to a seventh embodiment of the present invention. In the eighth embodiment, an example of the case in which a digital correction method according to this embodiment is applied to a pipeline analog-to-digital converter to be a commercially available chip component will be described. In FIG. 8, a configuration of a front step of an analog-to-digital conversion unit 81 is the same as the configuration in other embodiments.

The analog-to-digital converter according to the eighth embodiment includes a pipeline analog-to-digital conversion unit 81. The pipeline analog-to-digital conversion unit 81 generally includes an analog-to-digital conversion unit 811 and a digital output generation unit (DEC) 812 connected to an output thereof. A digital output $b_i$ of the pipeline analog-to-digital conversion unit 81 is input to a digital output generation inverse processing unit (RDEC) 82 and an output thereof is input to an odd-numbered sample-side digital correction unit 83 and an even-numbered sample-side digital correction unit 84.

The odd-numbered sample-side digital correction unit 83 outputs an analog-to-digital conversion result after odd-numbered sample-side correction, based on an odd-numbered digital output of the digital output generation inverse processing unit 82 and a correction coefficient supplied from a correction coefficient search unit 85. The even-numbered sample-side digital correction unit 84 outputs an analog-to-digital conversion result after even-numbered sample-side correction, based on an even-numbered digital output of the digital output generation inverse processing unit 82 and the correction coefficient supplied from the correction coefficient search unit 85.

A multiplication unit 86 outputs a multiplication result of the analog-to-digital conversion result after the odd-numbered sample-side correction and an attenuation rate estimation value $a_{EST}$ supplied from the correction coefficient search unit 85. A subtraction unit 87 outputs a result obtained by subtracting the multiplication result from the analog-to-digital conversion result after the even-numbered sample-side correction. The subtraction result is input as an "error e" to the correction coefficient search unit 85. The correction coefficient search unit 85 searches the correction coefficient and the attenuation rate estimation value $a_{EST}$, based on the error e, the digital output of the digital output generation inverse processing unit 82, and the analog-to-digital conversion result after the odd-numbered sample-side correction, and outputs a search result to the odd-numbered sample-side digital correction unit 83, the even-numbered sample-side digital correction unit 84, and the multiplication unit 86. In addition, the odd-numbered sample-side digital correction unit 83, the even-numbered sample-side digital correction unit 84, the correction coefficient search unit 85, the multiplication unit 86, and the subtraction unit 87 configure a correction unit 20b.

In a commercially available chip component of the analog-to-digital converter having redundancy in a conversion method, such as a pipeline type or a cyclic type, generally, a raw output $D_i$ (three values: ±1 and 0, and i=1, 2, ..., and M) of the analog-to-digital conversion unit 811 is processed by the digital output generation unit 812 in a chip and is output as binary data $b_i$, as illustrated in FIG. 8. In this case, it is difficult to completely restore $D_i$ of all bits, due to information degeneracy in the digital output generation unit 812. However, as illustrated in the same drawing, $D_i$ of the bits can be calculated by separating the raw outputs of the bits into raw outputs (for example, $D_1$ to $D_5$) of upper bits and binary synthetic values $D_{BE}$ (D BackEnd) of raw outputs of lower bits, by the digital output generation inverse processing unit 82.

Therefore, in FIG. 8, the correction coefficients $W_1$ to $W_5$ and $W_{BE}$ are searched using the above configuration and the correction is performed using a result thereof, similar to the first embodiment. Which bit the raw output $D_i$ can be correctly calculated to depend on a variation of a comparison voltage or a direct-current offset voltage in an internal circuit of the analog-to-digital conversion unit 811. This can be estimated by a data sheet or an auxiliary sequence before correction, even when the pipeline analog-to-digital converter is a commercially available chip component. For this reason, $D_i$ of a large amount of upper bits can be calculated and high correction precision can be realized.

When a successive comparison type analog-to-digital converter to be the commercially available chip component is set as a correction target, an output of the successive comparison type analog-to-digital converter is a raw output $D_i$ (two values: ±1) of the analog-to-digital conversion unit. For this reason, the digital output generation inverse processing unit 82 illustrated in FIG. 8 is not necessary. In this case, the correction can be executed, similar to the case of other embodiment (for example, in the case of FIG. 2A).

<<Correction Coefficient Search Operation of Analog-to-Digital Converter (Modification [1])>>

In the configuration of FIG. 8, in a correction operation mode, the correction coefficients $W_i$ and $W_{BE}$ and the attenuation rate estimation value $a_{EST}$ are searched by algorithms of formulas (17) to (19) and the formulas (3) and (5), similar to the first embodiment.

[Mathematical Formula 17] (Formula 17)

$$D_{OUT}^{ODD} = \sum_{i=1}^{5} W_i \cdot D_i^{ODD} + W_{BE} \cdot D_{BE}^{ODD}$$

-continued

[Mathematical Formula 18]    (Formula 18)

$$D_{OUT}^{EVEN} \sum_{i=1}^{5} W_i \cdot D_i^{EVEN} + W_{BE} \cdot D_{BE}^{EVEN}$$

[Mathematical Formula 19]    (Formula 19)

$$W_{BE}^{(NEW)} = W_{BE}^{(OLD)} - \mu_{WBE} \cdot e \cdot (D_{BE}^{EVEN} - a \cdot D_{BE}^{ODD})$$

In a normal operation mode, although not illustrated in the drawings, an original input signal voltage $V_{IN}$ is input to the pipeline analog-to-digital conversion unit 81, similar to the first embodiment. The pipeline analog-to-digital conversion unit 81 executes analog-to-digital conversion on the input signal voltage $V_{IN}$ and a digital output $b_i$ thereof is input to the digital output generation inverse processing unit (RDEC) 82. The digital output generation inverse processing unit (RDEC) 82 outputs $D_1$ to $D_5$ and the binary synthetic values $D_{BE}$ of the raw outputs of the lower bits. The even-numbered sample-side digital correction unit 84 executes an operation of a formula (20), using these outputs and the correction coefficients $W_i$ and $W_{BE}$ searched and obtained in the correction operation mode.

[Mathematical Formula 20]    (Formula 20)

$$D_{OUT} = \sum_{i=1}^{5} W_i \cdot D_i + W_{BE} \cdot D_{BE}$$

The even-numbered sample-side digital correction unit 84 executes the operation of the formula (20) on all of the samples, without depending on whether a sample is an odd-numbered sample or an even-numbered sample, and an output $D_{OUT}$ thereof becomes an entire output of a digital correction type analog-to-digital converter in the normal operation mode.

Eighth Embodiment

Schematic Configuration of Analog-to-Digital Converter (Modification [2])

Figure 10:
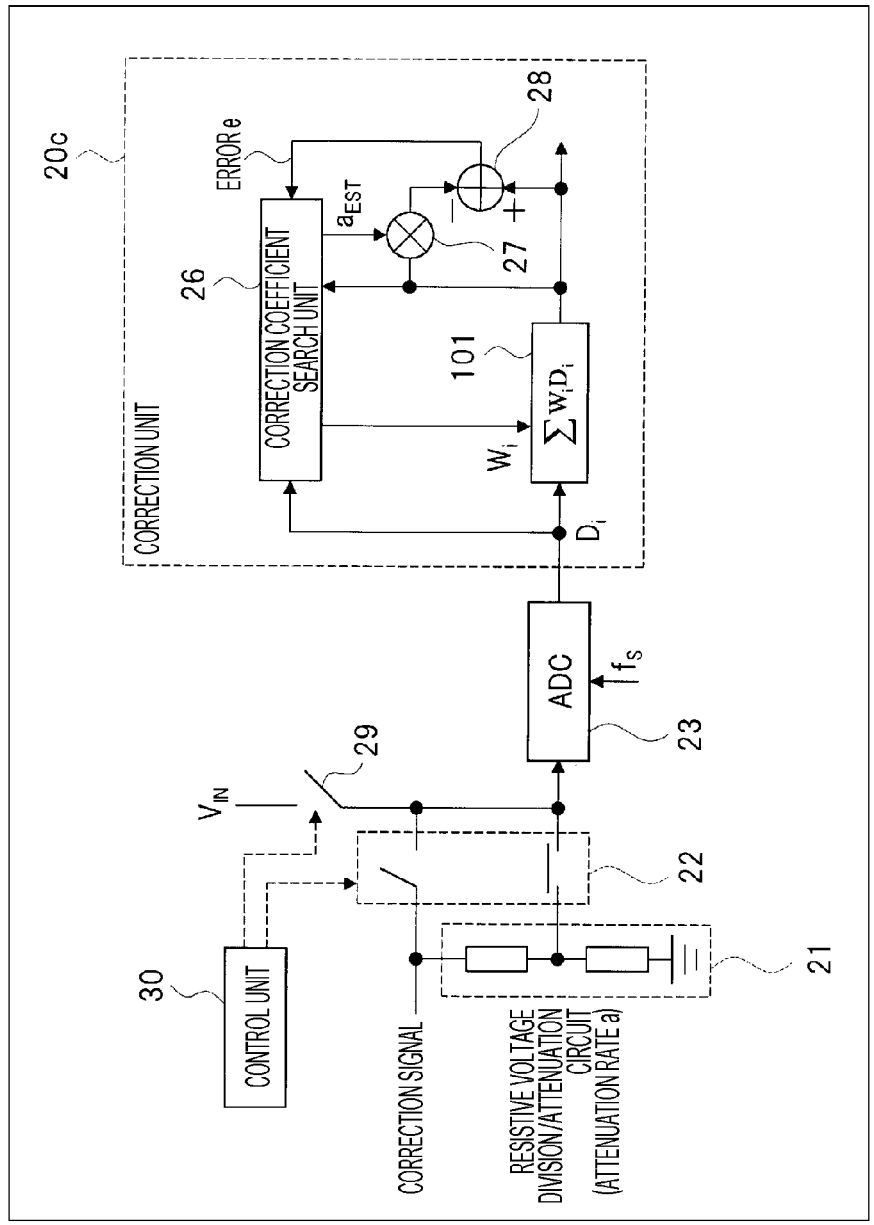
FIG. 10 is a schematic diagram illustrating a configuration example of an analog-to-digital converter according to an eighth embodiment of the present invention.

FIG. 10 is a schematic diagram illustrating a configuration example of an analog-to-digital converter according to an eighth embodiment of the present invention. The analog-to-digital converter of FIG. 10 has a configuration in which the odd-numbered sample-side digital correction unit 24 and the even-numbered sample-side digital correction unit 25 according to the first embodiment in FIG. 2A is replaced with one digital correction unit 101, in a correction unit 20c. In the first to fourth embodiments and the seventh embodiment described above, the odd-numbered sample-side digital correction unit and the even-numbered sample-side digital correction unit are provided separately. However, when the odd-numbered sample-side digital correction unit and the even-numbered sample-side digital correction unit are mounted in actuality, the odd-numbered sample-side digital correction unit and the even-numbered sample-side digital correction unit can be mounted as one digital correction unit, as illustrated in FIG. 10. As a result, a circuit scale of the correction unit in mounting can be reduced.

In the correction operation mode, similar to the first embodiment, a correction signal is input to an analog-to-digital conversion unit 23 and a digital correction unit 101 outputs an analog-to-digital conversion result after correction, based on a digital output $D_i$ (i=1, 2, . . . , and M) of the analog-to-digital conversion unit 23 and a correction coefficient $W_i$ supplied from a correction coefficient search unit 26. A multiplication unit 27 outputs a multiplication result of an analog-to-digital conversion result after the correction corresponding to an odd-numbered sample in the analog-to-digital conversion result after the correction and an attenuation rate estimation value $a_{EST}$ supplied from the correction coefficient search unit 26.

A subtraction unit 28 outputs a result obtained by subtracting the multiplication result of the multiplication unit 27 from an analog-to-digital conversion result after the correction corresponding to an even-numbered sample in the analog-to-digital conversion result after the correction. The subtraction result is input as an "error e" to the correction coefficient search unit 26. The correction coefficient search unit 26 searches the correction coefficient $W_i$ and the attenuation rate estimation value $a_{EST}$, based on the error e, the digital output $D_i$ (i=1, 2, . . . , and M) of the analog-to-digital conversion unit 23, and the analog-to-digital conversion result after the correction corresponding to the even-numbered sample, and outputs a search result to the digital correction unit 101 and the multiplication unit 27. In addition, in an operation of a normal operation mode, the correction is executed by the digital correction unit 101, regardless of the odd-numbered sample and the even-numbered sample, similar to the case of the first embodiment.

Ninth Embodiment

Schematic Configuration of Analog-to-Digital Converter (Modification [3])

Figure 11:
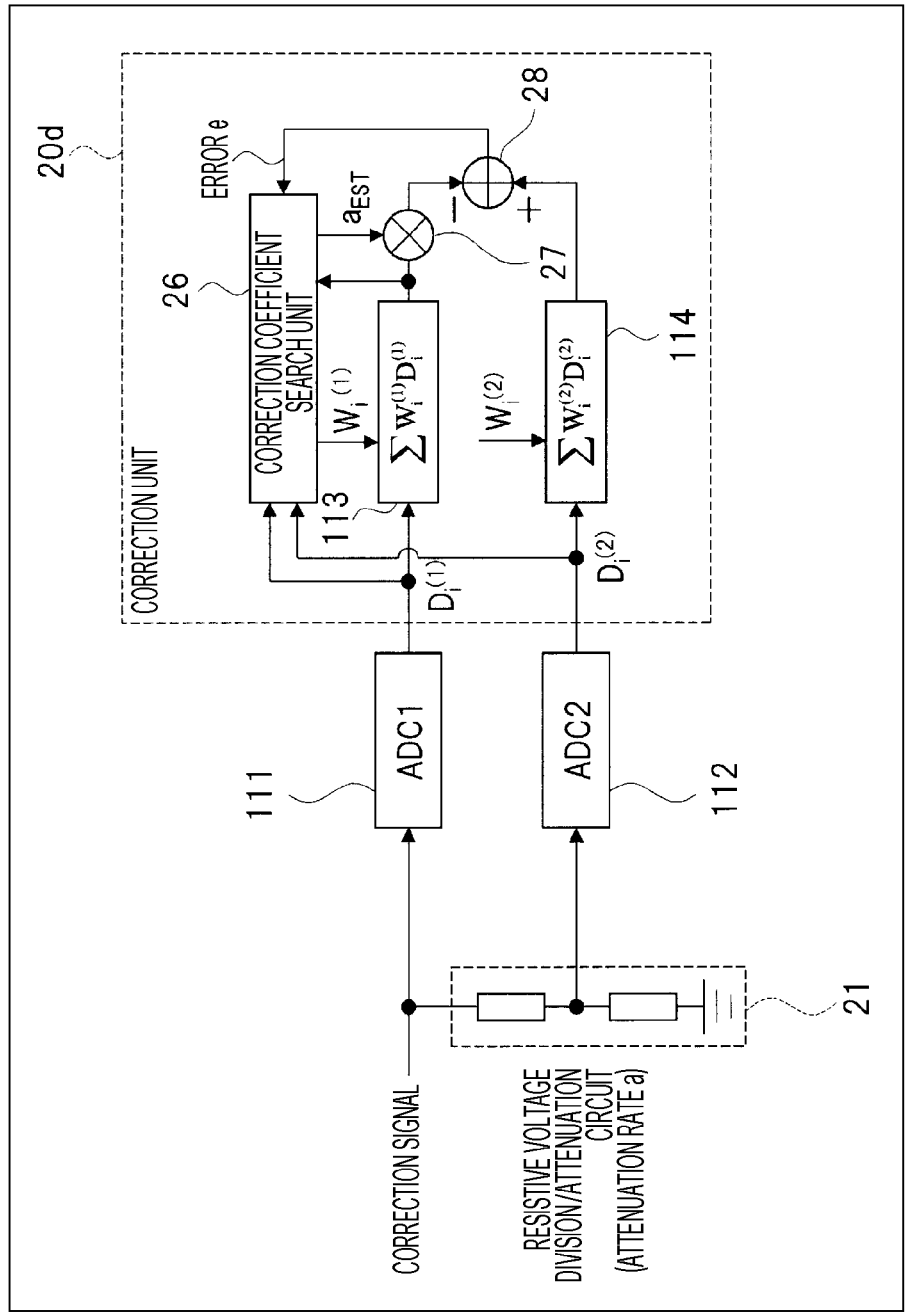
FIG. 11 is a schematic diagram illustrating a configuration example of an analog-to-digital converter according to a ninth embodiment of the present invention.

FIG. 11 is a schematic diagram illustrating a configuration example of an analog-to-digital converter according to a ninth embodiment of the present invention. In the ninth embodiment, the case in which a digital correction method according to this embodiment is applied to a system having two analog-to-digital conversion units will be described. In this case, as illustrated in FIG. 11, in a correction operation mode, a voltage of a correction signal is applied to one analog-to-digital conversion unit and a voltage obtained by attenuating the voltage of the correction signal with an attenuation circuit is applied to the other analog-to-digital conversion unit, so that a correction coefficient can be searched according to the same principle as the first embodiment. In FIG. 11, a configuration associated with the correction operation mode is illustrated and because a mechanism for applying an original input signal voltage to the two analog-to-digital conversion units is the same as that in the first embodiment, the mechanism is omitted.

In FIG. 11, an attenuation circuit (for example, a resistive voltage division circuit) 21 is connected to a correction signal application terminal. In the correction operation mode, a voltage (first analog voltage) of a correction signal is applied to an analog-to-digital conversion unit [1] (first analog-to-digital conversion unit) 111 and an output voltage (second analog voltage) of the attenuation circuit 21 is input to an analog-to-digital conversion unit [2] (second analog-to-digital conversion unit) 112. A digital output (first digital output signal) $D_i^{(1)}$ (i=1, 2, and M) of M bits of the analog-to-digital conversion unit [1] 111 is input to a digital correction unit [1] (first digital correction unit) 113. A digital output (second digital output signal) $D_i^{(2)}$ (i=1, 2, and M) of M bits of the analog-to-digital conversion unit [2] 112 is input to a digital correction unit [2] (second digital correction unit) 114.

The digital correction unit [1] 113 outputs an analog-to-digital conversion result [1] (first digital signal after correction) after correction, based on the digital output $D_i^{(1)}$ of the analog-to-digital conversion unit [1] 111 and a correction coefficient [1] (first correction coefficient) $W_i^{(1)}$ supplied from the correction coefficient search unit 26. The digital correction unit [2] 114 outputs an analog-to-digital conversion result [2] (second digital signal after correction) after correction, based on the digital output $D_i^{(2)}$ of the analog-to-digital conversion unit [2] 112 and a correction coefficient [2] (second correction coefficient) $W_i^{(2)}$ supplied from the correction coefficient search unit 26. A multiplication unit 27 outputs a multiplication result of the analog-to-digital conversion result [1] after the correction and an attenuation rate estimation value $a_{EST}$ supplied from the correction coefficient search unit 26. A subtraction unit (error detection unit) 28 outputs a result obtained by subtracting the multiplication result of the multiplication unit 27 from the analog-to-digital conversion result [2] after the correction. The subtraction result is input as an "error e" to the correction coefficient search unit 26.

The correction coefficient search unit 26 searches the correction coefficient [1] $W_i^{(1)}$, the correction coefficient [2] $W_i^{(2)}$, and the attenuation rate estimation value $a_{EST}$, based on the error e, the digital output $D_i^{(1)}$ of the analog-to-digital conversion unit [1] 111, the digital output $D_i^{(2)}$ of the analog-to-digital conversion unit [2] 112, and the analog-to-digital conversion result [1] after the correction. In addition, the search result is output to the digital correction unit [1] 113, the digital correction unit [2] 114, and the multiplication unit 27. As a result, the correction coefficient [1] $W_i^{(1)}$, the correction coefficient [2] $W_i^{(2)}$, and the attenuation rate estimation value $a_{EST}$ are searched by algorithms of the following formulas (21) to (26), similar to the first embodiment.

[Mathematical Formula 21] (Formula 21)
$$D_{OUT}^{(1)} = \sum_{i=1}^{M} W_i^{(1)} \cdot D_i^{(1)}$$

[Mathematical Formula 22] (Formula 22)
$$D_{OUT}^{(2)} = \sum_{i=1}^{M} W_i^{(2)} \cdot D_i^{(2)}$$

[Mathematical Formula 23] (Formula 23)
$$e = D_{OUT}^{(2)} - a_{EST} \cdot D_{OUT}^{(1)}$$

[Mathematical Formula 24] (Formula 24)
$$W_i^{(1)(NEW)} = W_i^{(1)(OLD)} + \mu_{Wi} \cdot e \cdot a \cdot D_i^{(1)}$$

[Mathematical Formula 25] (Formula 25)
$$W_i^{(2)(NEW)} = W_i^{(2)(OLD)} - \mu_{Wi} \cdot e \cdot D_i^{(2)}$$

[Mathematical Formula 26] (Formula 26)
$$a_{EST}^{(NEW)} = a_{EST}^{(OLD)} + \mu_a \cdot e \cdot D_{OUT}^{(1)}$$

In a normal operation mode, each original input signal voltage is input to the analog-to-digital conversion unit [1] 111 and the analog-to-digital conversion unit [2] 112. The digital correction unit [1] 113 executes the correction by the formula (21) using the correction coefficient [1] $w_i^{(1)}$ searched and obtained in the correction operation mode and outputs a digital output signal $D_{out}^{(1)}$ after the correction to be a correction result as a first analog-to-digital conversion output. Likewise, the digital correction unit [2] 114 executes the correction by the formula (22) using the correction coefficient [2] $w_i^{(2)}$ searched and obtained in the correction operation mode and outputs a digital output signal $D_{out}^{(2)}$ after the correction to be a correction result as a second analog-to-digital conversion output.

By using the analog-to-digital converter according to the ninth embodiment, the same effect as the first embodiment is obtained. Particularly, consumption power and a circuit area of the analog-to-digital conversion unit [1] 111 and the analog-to-digital conversion unit [2] 112 can be greatly reduced. Here, resolution of the analog-to-digital conversion unit [1] 111 and resolution of the analog-to-digital conversion unit [2] 112 are set to the same M bits, for convenience. However, the resolutions do not need to be the same and the present invention is effective to a combination of various resolutions.

The invention devised by the present inventors has been described specifically based on the embodiments. However, the present invention is not limited to the embodiments and various modifications can be made without departing from a scope thereof. For example, the embodiments are described in detail to facilitate the description of the present invention and the present invention is not limited to embodiments in which all of the described configurations are included. In addition, a part of the configurations of the certain embodiment can be replaced by the configurations of another embodiment or the configurations of another embodiment can be added to the configurations of the certain embodiment. In addition, for a part of the configurations of the individual embodiments, addition, removal, and replacement of other configurations can be performed.

Here, the specific formula example based on the LMS algorithm is illustrated as the adaptive control algorithm to search the correction coefficient. However, a variety of other search algorithms may be applied. In addition, here, the correction operation mode and the normal operation mode are provided. However, in some cases, it can be configured such that the correction coefficient can be searched in the normal operation mode. That is, the attenuation signal voltage of the original input signal voltage $V_{IN}$ may be generated by the attenuation circuit 21, the input signal voltage $V_{IN}$ and the attenuation signal voltage may be input, and the correction coefficient may be appropriately searched, updated, and reflected in the same way as the first embodiment. However, in this case, the attenuation circuit 21 may affect a voltage level of the input signal voltage $V_{IN}$ or the precision of the correction coefficient may be insufficient depending on amplitude of the input signal voltage $V_{IN}$. For this reason, from this point of view, the correction operation mode is preferably provided.

In addition, the resistive voltage division circuit is used as the attenuation circuit 21 in each embodiment. However, as described in the first embodiment, the capacitive voltage division circuit may be used. In addition, in each embodiment, the individual bit values $D_i$ configuring the digital output are not limited to the two values. For example, in the case of the pipeline analog-to-digital converter, three values (1, 0, −1) and seven values (3, 2, 1, 0, −1, −2, −3) may be taken.

REFERENCE SIGNS LIST 20a to 20d correction unit
21 attenuation circuit 22 path switching multiplexer
23 analog-to-digital conversion unit
24 odd-numbered sample-side digital correction unit
25 even-numbered sample-side digital correction unit
26 correction coefficient search unit
27 multiplication unit
28 subtraction unit
29 switch for input path
30 control unit
31 resistor ladder type multi-voltage generation unit
32 selector
33 selection signal generation unit
34a to 34e correction signal generation unit
41 digital-to-analog conversion unit
42 switch for DAC path
43 2 divider
51 sample-and-hold circuit
52 switch for S/H path
61 initial-step resistor ladder
62 selector [1]
63 next-step resistor ladder
64 selector [2]
71P selector [P] (normal phase side of selector)
71N selector [N] (reverse phase side of selector)
72P parallel resistor [P] (normal phase side of parallel resistor)
72N parallel resistor [N] (reverse phase side of parallel resistor)
73A to 73D resistor for attenuation circuit
74 path switching multiplexer
75 multiplexer for inversion
76 divider
81 pipeline analog-to-digital conversion unit
811 analog-to-digital conversion unit
812 digital output generation unit
82 digital output generation inverse processing unit
83 odd-numbered sample-side digital correction unit
84 even-numbered sample-side digital correction unit
85 correction coefficient search unit
86 multiplication unit
87 subtraction unit
101 digital correction unit
111 analog-to-digital conversion unit [1]
112 analog-to-digital conversion unit [2]
113 digital correction unit [1]
114 digital correction unit [2]

The invention claimed is:

1. An analog-to-digital converter, comprising:
an attenuation circuit to which a plurality of first analog voltages having different voltage values are sequentially input and which attenuates the plurality of first analog voltages with a predetermined attenuation rate and sequentially outputs a plurality of second analog voltages;
a first selection circuit to which the first and second analog voltages of a plurality of sets including sets of the first analog voltages and the second analog voltages obtained by attenuating the first analog voltages are sequentially input and which selects each analog voltage of the first and second analog voltages of the plurality of sets at different timing and outputs each analog voltage;
an analog-to-digital conversion unit which converts the first and second analog voltages of the plurality of sets output from the first selection circuit into first and second digital signals of a plurality of sets; and
a correction unit which searches M (M is an integer of 1 or more) correction coefficients multiplied with M bits of the first and second digital signals of the plurality of sets, based on the first and second digital signals of the plurality of sets.

2. The analog-to-digital converter according to claim 1, wherein
the attenuation circuit includes a resistive voltage division circuit or a capacitive voltage division circuit.

3. The analog-to-digital converter according to claim 2, wherein
the correction unit includes:
a digital correction unit which multiplies the M bits of the first and second digital signals with the M correction coefficients and generates first and second digital signals after correction, for each set of the first and second digital signals of the plurality of sets;
a multiplication unit which multiplies either the first digital signals after the correction or the second digital signals after the correction with an attenuation coefficient set to correspond to the attenuation rate and generates third digital signals;
an error detection unit which, when the first digital signals after the correction are multiplied with the attenuation coefficient, detects errors of the third digital signals and the second digital output signals after the correction and, when the second digital signals after the correction are multiplied with the attenuation coefficient, detects errors of the third digital signals and the first digital output signals after the correction; and
a correction coefficient search unit which searches the M correction coefficients such that the errors detected by the error detection unit approach to zero, for each set of the first and second digital signals of the plurality of sets.

4. The analog-to-digital converter according to claim 3, wherein
the correction coefficient search unit searches the attenuation coefficient such that the errors detected by the error detection unit approaches to the zero, for each set of the first and second digital signals of the plurality of sets.

5. The analog-to-digital converter according to claim 3, wherein
the first and second analog voltages of the different set are input to the first selection circuit at each input cycle and the first selection circuit selects the first analog voltage in some period of each input cycle and selects the second analog voltage in the remaining period.

6. The analog-to-digital converter according to claim 3, further comprising:
a correction signal generation unit which generates the plurality of first analog voltages;
an input switch which inputs a predetermined analog input voltage to the analog-to-digital conversion unit, at the time of being controlled to ON; and
a correction operation mode and a normal operation mode,
wherein, in the correction operation mode, the analog-to-digital converter controls the input switch to OFF, inputs the analog voltages selected by the first selection circuit to the analog-to-digital conversion unit, and searches the M correction coefficients, and
in the normal operation mode, in a state in which an output of the first selection circuit is in an open state, the analog-to-digital converter controls the input switch to ON, converts the predetermined analog input voltage into a predetermined digital signal using the analog-to-digital conversion unit, corrects the predetermined digital signal with the M correction coefficients searched in the correction operation mode using the digital correction unit, and outputs digital output signals after the correction to be a correction result.

7. The analog-to-digital converter according to claim 6, wherein
the correction signal generation unit includes:
a resistive voltage division circuit for correction which divides a predetermined fixed voltage; and
a second selection circuit which sequentially selects a plurality of resistive voltage division nodes included in the resistive voltage division circuit for the correction and sequentially generates the plurality of first analog voltages.

8. The analog-to-digital converter according to claim 6, wherein
the correction signal generation unit includes a third selection circuit which includes a plurality of selection switches and selectively applies a predetermined fixed voltage to a plurality of nodes and a plurality of parallel resistors of which one end is connected commonly to an input node of the attenuation circuit and the other ends are connected to the plurality of nodes of the third selection circuit, and
one or more selection switches controlled to ON among the plurality of selection switches are sequentially determined and the plurality of first analog voltages are sequentially generated in the input node of the attenuation circuit.

9. The analog-to-digital converter according to claim 6, wherein
the correction signal generation unit includes a digital-to-analog conversion unit.

10. An analog-to-digital converter, comprising:
an attenuation circuit to which a plurality of first analog voltages having different voltage values are sequentially input and which attenuates the plurality of first analog voltages with a predetermined attenuation rate and sequentially outputs a plurality of second analog voltages;
a first analog-to-digital conversion unit which converts the plurality of first analog voltages among the first and second analog voltages of a plurality of sets including sets of the first analog voltages and the second analog voltages obtained by attenuating the first analog voltages into a plurality of first digital signals;
a second analog-to-digital conversion unit which converts the plurality of second analog voltages among the first and second analog voltages of the plurality of sets into a plurality of first digital signals; and
a correction unit which searches M (M is an integer of 1 or more) first correction coefficients multiplied with M bits of the plurality of first digital signals and M second correction coefficients multiplied with M bits of the plurality of second digital signals, based on the first and second digital signals of the plurality of sets converted by the first and second analog-to-digital conversion units.

11. The analog-to-digital converter according to claim 10, wherein
the attenuation circuit includes a resistive voltage division circuit or a capacitive voltage division circuit.

12. The analog-to-digital converter according to claim 11, wherein
the correction unit includes:
a first digital correction unit which multiplies the M bits of the first digital signals with the M first correction coefficients and generates first digital signals after correction, for each set of the first and second digital signals of the plurality of sets;
a second digital correction unit which multiplies the M bits of the second digital signals with the M second correction coefficients and generates second digital signals after correction, for each set of the first and second digital signals of the plurality of sets;
a multiplication unit which multiplies either the first digital signals after the correction or the second digital signals after the correction with an attenuation coefficient set to correspond to the attenuation rate and generates third digital signals;
an error detection unit which, when the first digital signals after the correction are multiplied with the attenuation coefficient, detects errors of the third digital signals and the second digital output signals after the correction and, when the second digital signals after the correction are multiplied with the attenuation coefficient, detects errors of the third digital signals and the first digital output signals after the correction; and
a correction coefficient search unit which searches the M first and second correction coefficients such that the errors detected by the error detection unit approach to zero, for each set of the first and second digital signals of the plurality of sets.

13. An analog-to-digital converter, comprising:
an attenuation circuit to which first analog signals set to different voltage values at each cycle are input and which attenuates the first analog signals with a predetermined attenuation rate and generates second analog signals;
a first selection circuit to which the first and second analog signals are input and which selects and outputs the first analog signals in some period of each cycle and selects and outputs the second analog signals in the remaining period, at each cycle;
an analog-to-digital conversion unit which converts the first analog signals output from the first selection circuit into first digital signals and converts the second analog signals output from the first selection circuit into second digital signals, at each cycle; and
a correction unit which searches M (M is an integer of 1 or more) correction coefficients multiplied with M bits of the first and second digital signals, based on the first and second digital signals at each cycle.

14. The analog-to-digital converter according to claim 13, wherein
the attenuation circuit includes a resistive voltage division circuit or a capacitive voltage division circuit.

15. The analog-to-digital converter according to claim 14, wherein
the correction unit includes:
a digital correction unit which multiplies the M bits of the first and second digital signals with the M correction coefficients and generates first and second digital signals after correction, at each cycle;
a multiplication unit which multiplies either the first digital signals after the correction or the second digital signals after the correction with an attenuation coefficient set to correspond to the attenuation rate and generates third digital signals;

an error detection unit which, when the first digital signals after the correction are multiplied with the attenuation coefficient, detects errors of the third digital signals and the second digital output signals after the correction and, when the second digital signals after the correction are multiplied with the attenuation coefficient, detects errors of the third digital signals and the first digital output signals after the correction; and a correction coefficient search unit which searches the M correction coefficients such that the errors detected by the error detection unit approach to zero, at each cycle.

\* \* \* \* \*